(12) United States Patent
Jyumonji

(10) Patent No.: US 10,770,886 B2
(45) Date of Patent: Sep. 8, 2020

(54) ELECTROMAGNETIC LOAD DRIVE DEVICE AND IN-VEHICLE CONTROL SYSTEM

(71) Applicant: HITACHI AUTOMOTIVE SYSTEMS, LTD., Ibaraki (JP)

(72) Inventor: Kentarou Jyumonji, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 220 days.

(21) Appl. No.: 16/073,636

(22) PCT Filed: Jan. 10, 2017

(86) PCT No.: PCT/JP2017/000364
§ 371 (c)(1),
(2) Date: Jul. 27, 2018

(87) PCT Pub. No.: WO2017/130669
PCT Pub. Date: Aug. 3, 2017

(65) Prior Publication Data
US 2019/0036325 A1    Jan. 31, 2019

(30) Foreign Application Priority Data
Jan. 29, 2016 (JP) .................................. 2016-016317

(51) Int. Cl.
*H02H 3/22* (2006.01)
*H03K 17/00* (2006.01)
(Continued)

(52) U.S. Cl.
CPC ......... *H02H 3/22* (2013.01); *G01R 19/16528* (2013.01); *G05F 1/56* (2013.01);
(Continued)

(58) Field of Classification Search
CPC .... H02H 3/22; H02H 1/0007; H03K 17/0822; H03K 17/00; H01H 47/002; H01F 7/1844; G01R 19/16528
See application file for complete search history.

(56) References Cited

U.S. PATENT DOCUMENTS 6,094,021 A    7/2000   Noro et al.
6,147,498 A    11/2000  Sumiya et al.
(Continued)

FOREIGN PATENT DOCUMENTS

JP    10-231947 A    9/1998
JP    11-218256 A    8/1999
(Continued)

OTHER PUBLICATIONS

International Search Report dated Apr. 25, 2017 for the PCT International Application No. PCT/JP2017/000364.
(Continued)

*Primary Examiner* — Jue Zhang
(74) *Attorney, Agent, or Firm* — Volpe and Koenig, P.C.

(57) ABSTRACT

To provide an electromagnetic bad driving device capable of performing failure diagnosis of a relay more frequently. The electromagnetic bad driving device according to the present invention, interrupts the relay while an electromagnetic induction bad is under control, and diagnoses the relay on the basis of a surge voltage occurring at the interruption.

11 Claims, 18 Drawing Sheets

(51) Int. Cl.
- *H03K 17/082* (2006.01)
- *G05F 1/56* (2006.01)
- *G01R 19/165* (2006.01)
- *H02H 1/00* (2006.01)
- *H01H 47/00* (2006.01)
- *H01F 7/18* (2006.01)

(52) U.S. Cl.
CPC ........... *H02H 1/0007* (2013.01); *H03K 17/00* (2013.01); *H03K 17/0822* (2013.01); *H01F 7/1844* (2013.01); *H01H 47/002* (2013.01)

(56) References Cited

U.S. PATENT DOCUMENTS

| | | | | |
|---|---|---|---|---|
| 7,403,366 B2 * | 7/2008 | Melchert | ................ | H01H 47/32 361/139 |
| 7,463,984 B2 * | 12/2008 | Kollner | ................ | G01R 31/52 702/58 |
| 2005/0286200 A1 | 12/2005 | Ohshima | | |
| 2011/0149444 A1 * | 6/2011 | Koolen | ................ | H05B 45/50 361/18 |
| 2018/0201209 A1 * | 7/2018 | Jyumonji | ................ | H01H 47/00 |

FOREIGN PATENT DOCUMENTS

| | | |
|---|---|---|
| JP | 2000-152691 A | 5/2000 |
| JP | 2002-345291 A | 11/2002 |
| JP | 2004-201410 A | 7/2004 |
| JP | 2006-005581 A | 1/2006 |

OTHER PUBLICATIONS

Japanese Office Action dated Apr. 23, 2019 for the Japanese Patent Application No. 2017-563767.

* cited by examiner

ELECTROMAGNETIC LOAD DRIVE DEVICE AND IN-VEHICLE CONTROL SYSTEM

TECHNICAL FIELD

The present invention relates to a technique of controlling an electromagnetic load.

BACKGROUND ART

Conventionally, an electromagnetic load driving device that drives an electromagnetic induction load, includes a switching element (e.g., relay element) that interrupts an energizing current supplied to the electromagnetic induction load. A failure of a relay disables load control from continuing normally, and thus the electromagnetic load driving device typically performs failure diagnosis to the relay.

PTL 1 discloses the following technique for "enabling, in an inductive load driving device including two switching elements provided in series on an energizing path, an on-failure of each switching element to be detected even during energizing control". "In energization-zero control in which a target current is zero (S140: NO) during normal control with a configuration including a duty driving transistor T10 provided on the upstream side of a linear solenoid and a fail-safe transistor T20 provided on the downstream side of the linear solenoid, the duty driving transistor T10 continues duty driving in arbitrary duty cycle and the fail-safe transistor T20 turns off, to make the energization zero (S260), instead of making the duty cycle of the duty driving transistor T10 zero to make the energization zero. If an energizing current is not zero at this time, it is determined that the fail-safe transistor T20 has on-failed (S300) (refer to abstract)."

CITATION LIST

Patent Literature

PTL 1: JP 2004-201410 A

SUMMARY OF INVENTION

Technical Problem

In order to prevent influence from occurring in the control precision of the energizing current supplied to a load in the conventional technique in PTL 1, failure diagnosis is performed under a limited condition, such as immediately after switching of the energizing path to the load or a period during which the load is inactive. When the period of the performance of the failure diagnosis is limited in this manner, the number of times of the performance of the failure diagnosis correspondingly decreases and thus the frequency of detecting a failure of a relay may decrease.

The present invention has been made in consideration of the problem, and an object of the present invention is to provide an electromagnetic load driving device capable of performing failure diagnosis of a relay more frequently.

Solution to Problem

The electromagnetic load driving device according to the present invention, interrupts the relay while an electromagnetic induction load is under control, and diagnoses the relay on the basis of a surge voltage occurring at the interruption.

Advantageous Effects of Invention

The electromagnetic load driving device according to the present invention, can perform the failure diagnosis to the relay, inhibiting influence to the driving precision of the electromagnetic induction load.

DESCRIPTION OF EMBODIMENTS

First Embodiment: Device Configuration

Figure 1:
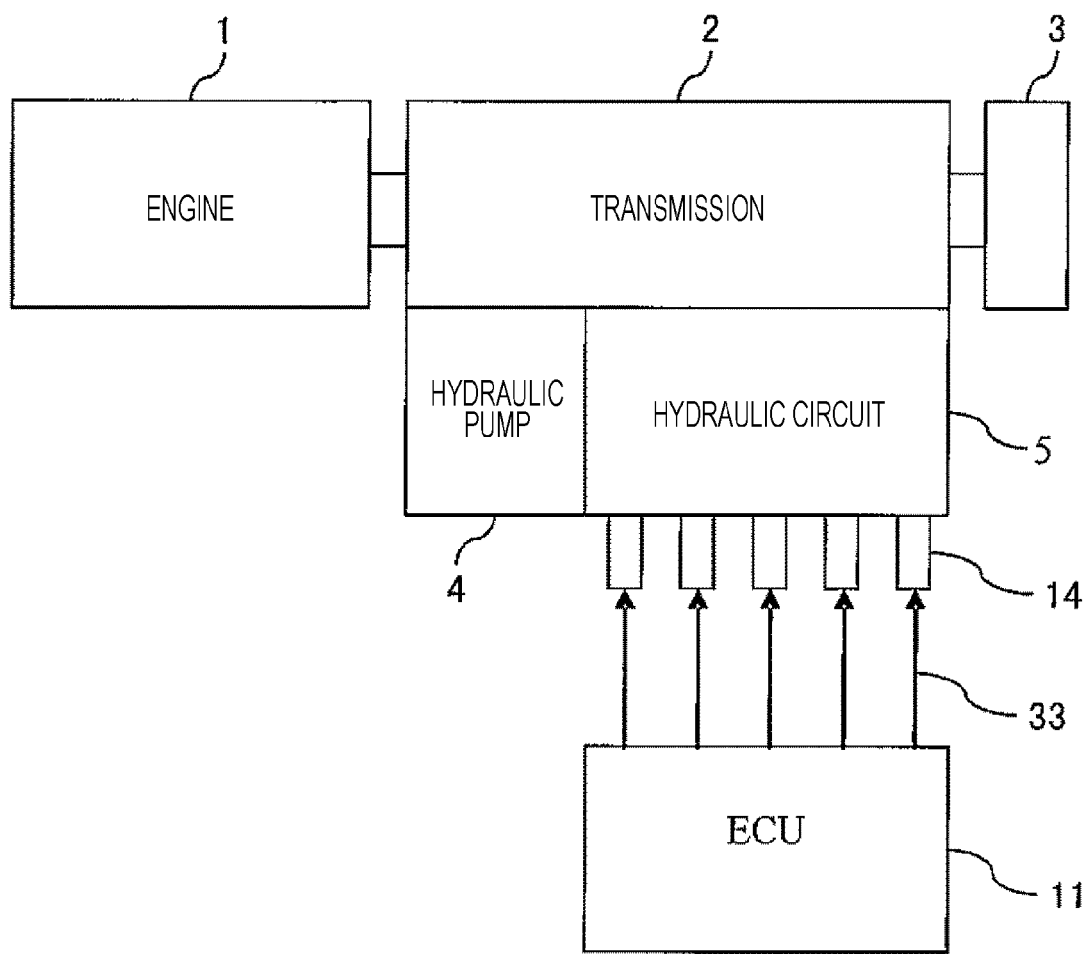
FIG. 1 is a schematic diagram of the configuration of an automatic transmission of a vehicle equipped with an electronic control unit (ECU) 11 according to a first embodiment.

FIG. 1 is a schematic diagram of the configuration of an automatic transmission of a vehicle equipped with an electronic control unit 11 (ECU) according to a first embodiment of the present invention. A rotation output output from an engine 1, is input to a transmission 2. The transmission 2 decelerates the rotation output, to output the rotation output to a driving wheel 3. A hydraulic circuit 5 controls the transmission gear ratio of the transmission 2. A hydraulic pump 4 generates hydraulic pressure for allowing the hydraulic circuit 5 to operate. An electromagnetic induction load (solenoid) 14 switches the hydraulic circuit 5. The electronic control unit (ECU) outputs a load current 33 for driving the electromagnetic induction load 14.

Figure 2:
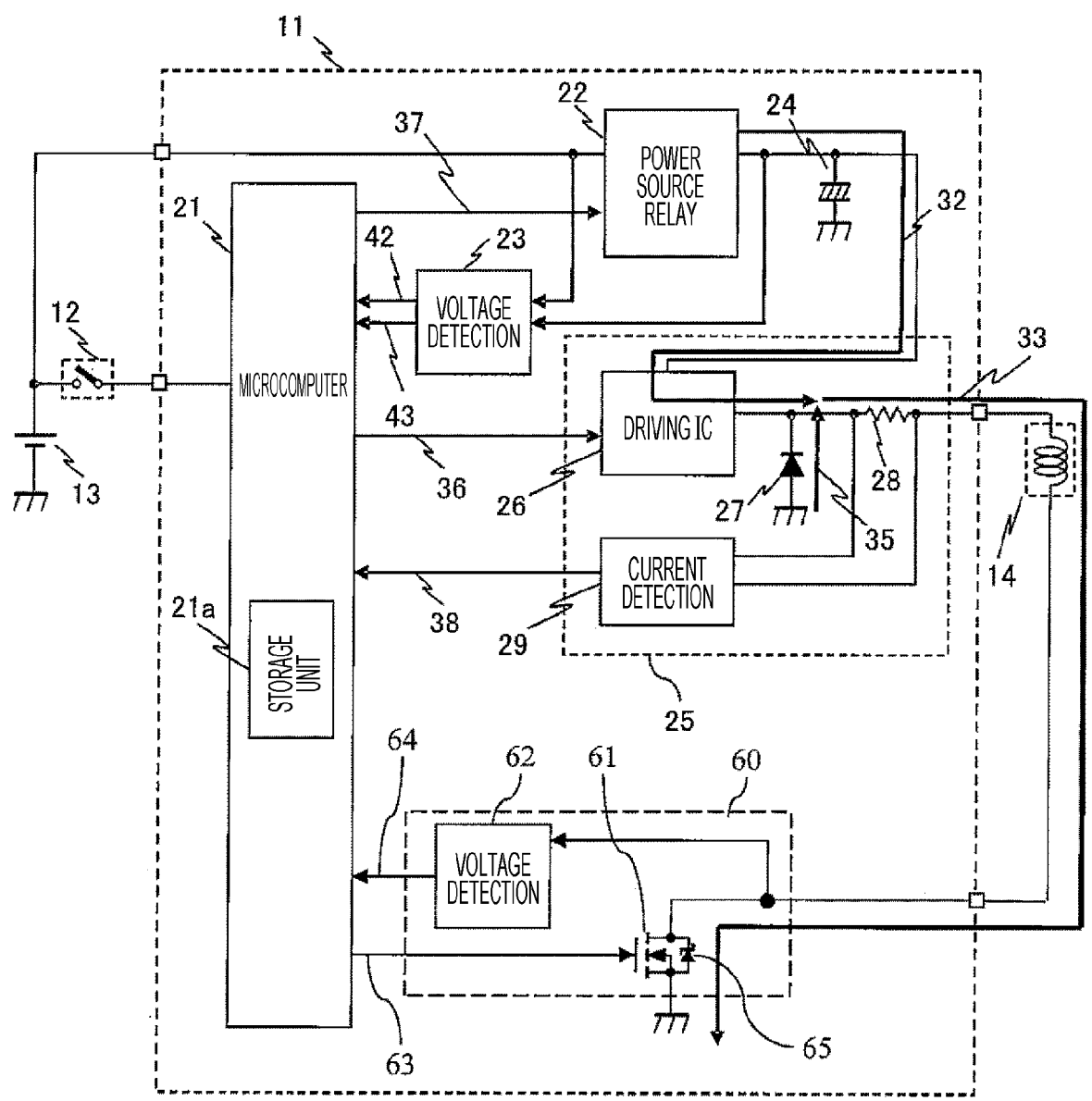
FIG. 2 is a circuit diagram of the ECU 11.

FIG. 2 is a circuit diagram of the ECU 11. The ECU 11 includes a microcomputer 21, a power source relay 22, a voltage detecting unit 23, a load driving circuit 25, a capacitor 24, and an interrupting circuit 60.

The power source relay 22 is connected to the downstream side of an in-vehicle battery 13. The capacitor for voltage smoothing and the load driving circuit 25 are connected in parallel to each other on the downstream side of the power source relay 22. The voltage detecting unit 23 is connected to the upstream side and downstream side of the power source relay 22, and monitors the upstream voltage and downstream voltage of the power source relay 22, to output a result of the monitoring to the microcomputer 21. The result of the monitoring to be input to the microcomputer 21, includes an upstream voltage 42 and a downstream voltage 43. A switch 12 is connected to the downstream side of the in-vehicle battery 13, and is turned on and off in starting and stopping the ECU 11, respectively.

The power source relay 22 is driven with a relay driving signal 37, to supply or interrupt a power source voltage (voltage supplied by the in-vehicle battery 13) to a circuit disposed on the downstream side of the power source relay 22. When the power source relay 22 is on (energization), the upstream voltage 42 and the downstream voltage 43 of the power source relay 22 are identical to each other. When the power source relay 22 is off (interruption), the upstream voltage 42 and the downstream voltage 43 of the power source relay 22 have respective different values.

The load driving circuit 25 controls a driving voltage for driving the electromagnetic induction load 14 and an energizing current 32 flowing in the electromagnetic induction load 14. The load driving circuit 25 includes a driving integrated circuit (IC) 26, a freewheeling diode 27, a current detecting resistor 28, and a current detecting unit 29. The driving IC 26 controls a switching element in accordance with a driving signal 36 (e.g., pulse width modulation control) to control the waveform of the energizing current 32, and then outputs the controlled energizing current 32 to the electromagnetic induction load 14. The current detecting unit 29 detects the actual load current 33 with the current detecting resistor 28, to output a result of the detection as an actual current signal 38, to the microcomputer 21.

The microcomputer 21 calculates the difference between a target current and the actual current signal 38 received from the current detecting unit 29, and then determines the duty of the driving signal 36 for operating the driving IC 26, on the basis of the difference, to operate the driving IC 26. When the duty of the driving signal 36 is high, the energizing current 32 increases. When the duty is low, the energizing current 32 decreases. The load current 33 includes the energizing current 32 output from the driving IC 26 and a freewheeling current 35 output from the freewheeling diode 27. The energizing current 32 flows only while the driving IC 26 is in operation, and does not flow while the driving IC 26 is out of operation. The freewheeling current 35 flows only during a non-operating period after transition of the driving IC 26 from the operating state to the non-operating state.

The interrupting circuit 60 includes a current interrupting relay 61 and a voltage detecting unit 62. The current interrupting relay 61 is a switching element for interrupting the energizing current 32 of the electromagnetic induction load 14. The voltage detecting unit 62 monitors an upstream voltage 64 of the current interrupting relay 61. The current interrupting relay 61 is controlled with a current interrupting signal 63. When the load driving circuit 25 is in energization and the current interrupting relay 61 is in energization, the upstream voltage 64 is identical to a ground. When the load driving circuit 25 is in energization and the current interrupting relay 61 is in interruption, the load current attempts to continue flowing and a counter electromotive voltage (surge voltage) occurs upstream from the current interrupting relay 61, so that the upstream voltage 64 reaches approximately the power source voltage or more. A voltage limiting element 65 that limits the counter electromotive voltage, is connected in parallel with the current interrupting relay 61. The voltage limiting element 65 may be built in the current interrupting relay 61 or may be independent of the current interrupting relay 61. The voltage limiting element 65 prevents an excessive voltage from being applied to the current interrupting relay 61.

First Embodiment: Device Operation

Figure 3:
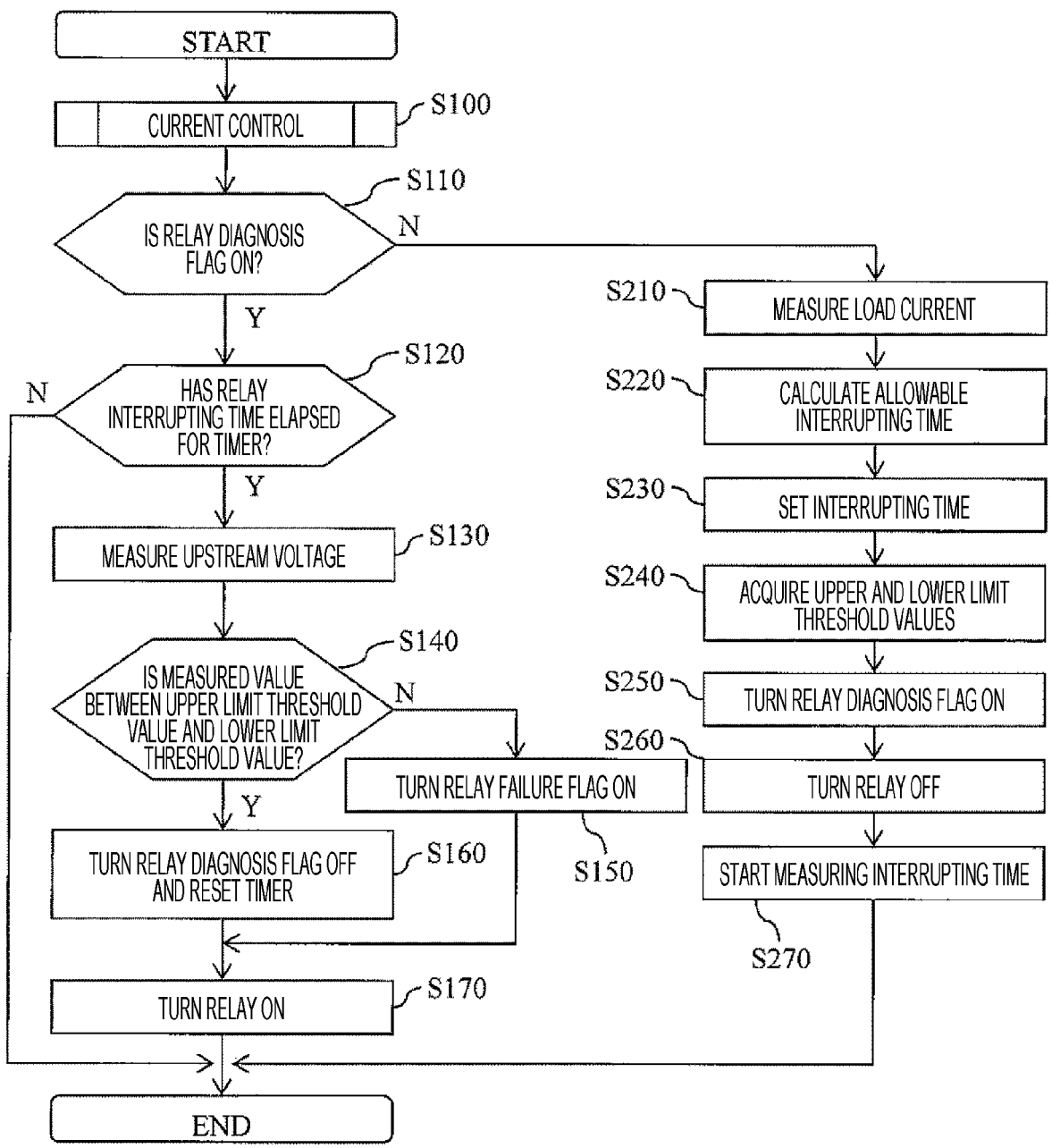
FIG. 3 is a flowchart for describing a procedure in which the ECU 11 performs failure diagnosis of a current interrupting relay 61.

FIG. 3 is a flowchart for describing a procedure in which the ECU 11 performs failure diagnosis of the current interrupting relay 61. Each step of FIG. 3 will be described below.

(FIG. 3: Step S100) After starting, the microcomputer 21 performs self-failure diagnosis to the microcomputer 21 itself or a peripheral circuit thereof, and migrates into a normal control mode when checking that the ECU 11 is ready to control the load properly. During normal control, the present flowchart is repeatedly performed on the basis of various types of information input to the microcomputer 21, to control the load current 33.

(FIG. 3: Step S110)

The microcomputer 21 determines whether a relay diagnosis flag is on. When the relay diagnosis flag is on, the processing is performed from steps S120 to S170. When the relay diagnosis flag is off, the processing is performed from steps S210 to S270. The processing from steps S210 to S270 is preprocessing to be performed before the relay failure diagnosis. The processing from steps S120 to S170 is failure diagnosis processing. For the convenience of descriptions, steps S210 to S270 will be first described below.

(FIG. 3: Steps S210 and S220)

The microcomputer 21 measures the load current 33 (S210). The microcomputer 21 calculates the allowable interrupting time of the current interrupting relay 61 (S220). The allowable interrupting time of the current interrupting relay 61 is a time during which the variation of the energizing current 32 flowing in the electromagnetic induction load 14, is allowed to be within an allowable range while the current interrupting relay 61 is being interrupted. A specific example will be described with FIGS. 4 and 5 to be described later.

(FIG. 3: Step S230)

The microcomputer 21 sets an actual interrupting time of the current interrupting relay 61 (relay interrupting time), on the basis of the allowable interrupting time calculated at step S220. The relay interrupting time is shorter than the allowable interrupting time. This is because, if the relay interrupting time is longer than the allowable interrupting time, the energizing current 32 considerably deviates from the target current and the control precision of driving the electromagnetic induction load 14 is degraded due to an energizing current shortage.

(FIG. 3: Step S240)

The microcomputer 21 acquires upper and lower limit threshold values to be used in performing the failure diagnosis of the current interrupting relay 61. Specifically, a range in which the upstream voltage 64 rises due to the counter electromotive voltage when the current interrupting relay 61 is interrupted, is previously grasped in accordance with an electric characteristic of the voltage limiting element 65. Then, in consideration of circuit variation, the upper and lower limit threshold values are set in the neighborhood of the range. For example, when the upstream voltage 64 is assumed to be in a range of 26V to 28 V in consideration of the circuit variation, the upper limit threshold value is 28V and the lower limit threshold value is 26 V.

(FIG. 3: Step S240: Supplement)

The rise range of the upstream voltage 64 due to the counter electromotive voltage, is almost dominantly determined due to the electric characteristic of the voltage limiting element 65, and thus the upper and lower limit threshold values determined at the present step, can be previously fixedly determined. Note that, the rise range may vary due to a temperature characteristic of the element. In that case, the temperature characteristic is previously described, for example, in a data table, and then collation of a temperature acquired from a separately provided temperature sensor with the temperature characteristic enables the rise range of the upstream voltage 64 to be calculated.

(FIG. 3: Steps S250 to S270)

The microcomputer 21 sets the relay diagnosis flag ON (S250). The microcomputer 21 turns the current interrupting relay 61 off (interruption) (S260). The microcomputer 21 starts an interrupting time timer used for measuring a time while the current interrupting relay 61 is being interrupted (S270).

(FIG. 3: Step S120)

The microcomputer 21 determines whether the relay interrupting time set at step S230 has elapsed from the interruption of the current interrupting relay 61 until the current time. The interrupting time timer started at step S270 measures the elapsed time. When the relay interrupting time has not elapsed, the present flowchart finishes (failure diagnosis of the current interrupting relay 61 is not performed). When the relay interrupting time has elapsed, the processing proceeds to step S130.

(FIG. 3: Steps S130 and S140)

The microcomputer 21 measures the upstream voltage 64 (S130). The microcomputer 21 determines whether the upstream voltage 64 is between the upper limit threshold value and the lower limit threshold value set at step S240 (S140). When the upstream voltage 64 is between the upper limit threshold value and the lower limit threshold value (current interrupting relay 61 is normal), the processing proceeds to step S160. When the upstream voltage 64 is not between the upper limit threshold value and the lower limit threshold value (current interrupting relay 61 is abnormal), the processing proceeds to step S150.

(FIG. 3: Steps S150 and S160)

When determining that the current interrupting relay 61 is abnormal, the microcomputer 21 sets a relay failure flag on (S150). When determining that the current interrupting relay 61 is normal, the microcomputer 21 turns the relay diagnosis flag off and resets the interrupting time timer (S160).

(FIG. 3: Step S170)

The microcomputer 21 turns the current interrupting relay 61 on, and then finishes the flowchart of FIG. 3.

Figure 4:
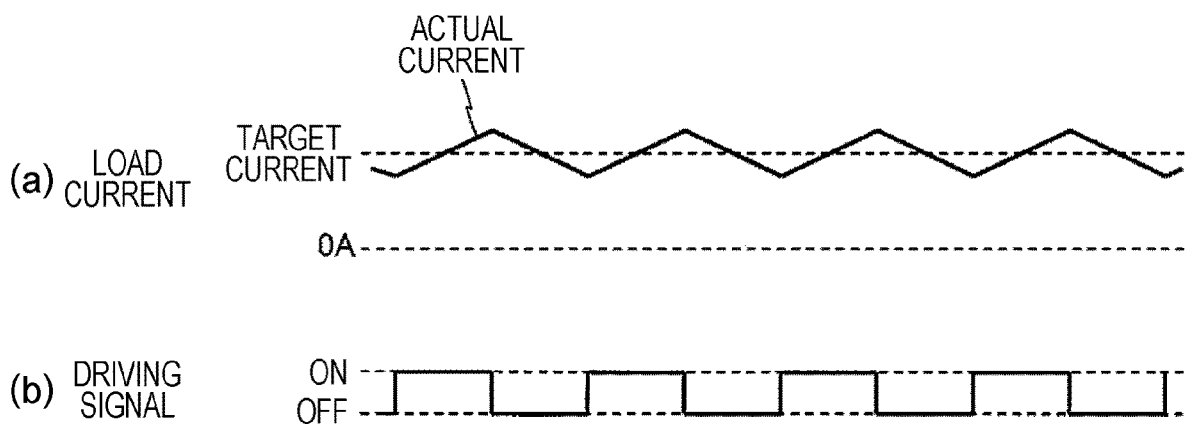
FIG. 4 is a time chart of the relationship between a target current and an actual current.

FIG. 4 is a time chart of the relationship between the target current and an actual current. Typically, the driving IC 26 controls the energizing current 32 flowing in the electromagnetic induction load 14, to be identical to the target current. However, a difference occurs between the actual current flowing actually and the target current, as illustrated in FIG. 4. The microcomputer 21 controls the energizing current 32 through the driving IC 26 such that the difference is in the allowable range and the difference converges to zero, on the basis of the control precision required in controlling the electromagnetic induction load 14. The variation in turning the current interrupting relay 61 off, should be within the allowable range. The allowable interrupting time to be calculated at step S220, is set on the basis of the above.

Figure 5:
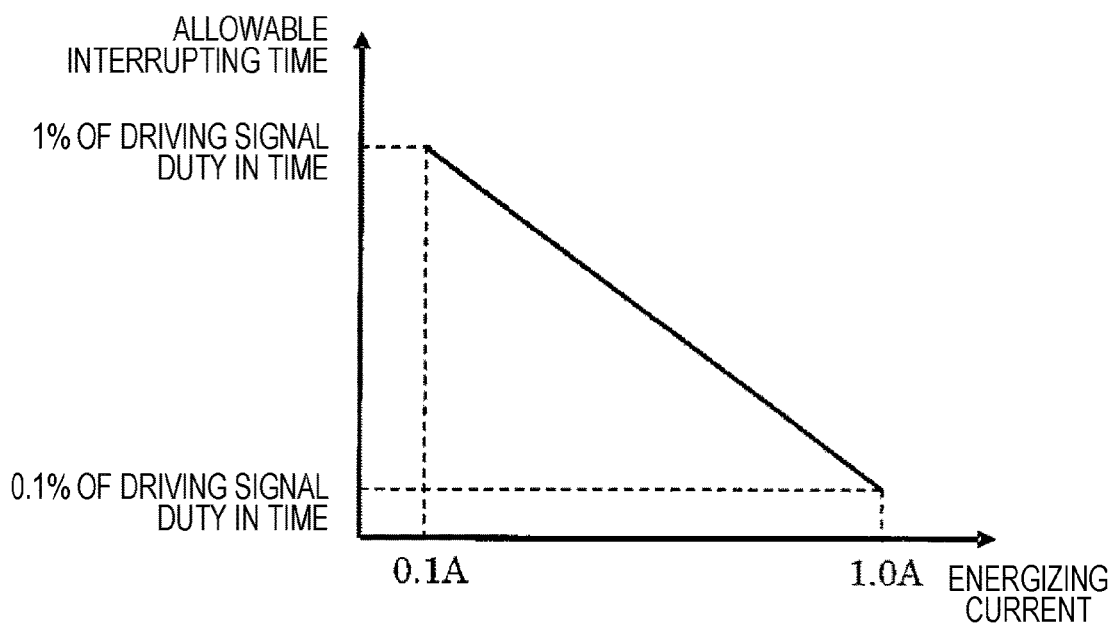
FIG. 5 is a graph exemplifying a characteristic indicating the correspondence between an energizing current 32 and an allowable interrupting time.

FIG. 5 is a graph exemplifying a characteristic indicating the correspondence between the energizing current 32 and the allowable interrupting time. The microcomputer 21 stores data describing the correspondence as illustrated in FIG. 5, for example, in a storage device 21a inside the microcomputer 21, and calculates the allowable interrupting time of the current interrupting relay 61 in accordance with the data. When the energizing current 32 is, for example, 1.0 A, the allowable interrupting time corresponds to 0.1% of the duty of the driving signal 36. The characteristic illustrated in FIG. 5, can be also determined in consideration of the variation or degradation of the internal element/load of the ECU 11 or in consideration of experimental data.

Figure 6:
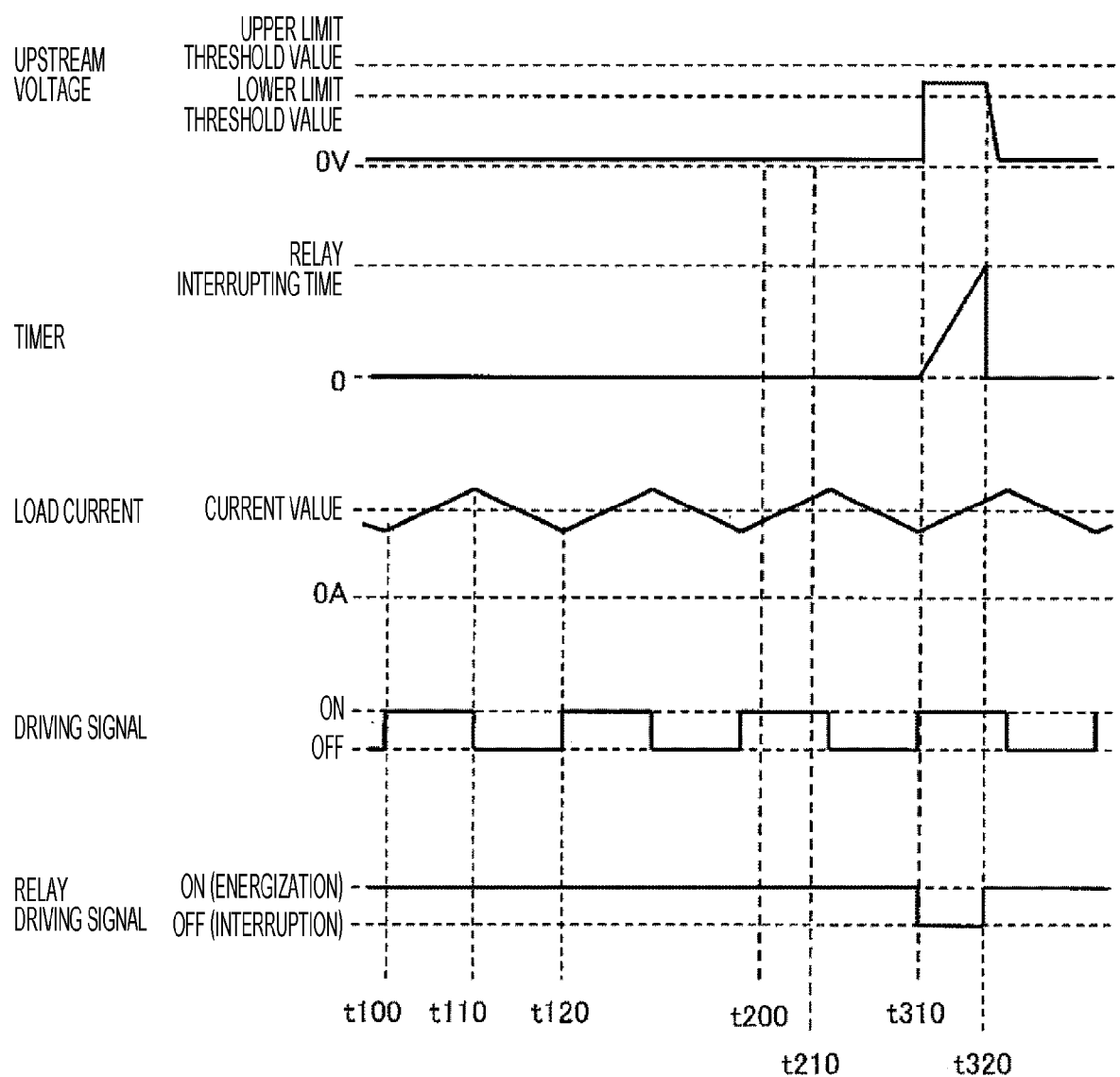
FIG. 6 is a timing chart for describing a process in which the ECU 11 performs the failure diagnosis of the current interrupting relay 61.

FIG. 6 is a timing chart for describing a process in which the ECU 11 performs the failure diagnosis of the current interrupting relay 61. One cycle of the driving signal of the load driving circuit 25, ranges from time t100 to time t120. The driving signal 36 is on from time t100 to time t110, and thus the energizing current 32 flows in the electromagnetic induction load 14. The driving signal 36 is off from time t110 to time t120, and thus the freewheeling current 35 flows in the electromagnetic induction load 14. The microcomputer 21 performs the processing from steps S210 to S250 from time t200 to time t210. At time t310, the microcomputer 21 turns the current interrupting relay 61 off. The relay interrupting time ranges from time t310 to time t320, and the upstream voltage 64 rises. The microcomputer 21 performs the failure diagnosis of the current interrupting relay 61 at time t320.

First Embodiment: Effect

The ECU 11 according to the first embodiment, interrupts the current interrupting relay 61 in the allowable range of the variation in the control precision of the energizing current 32 even in the normal control period during which the electromagnetic induction load 14 is being driven. This arrangement can inhibit influence to the driving control precision due to the interruption. Therefore, the frequency of detecting a failure of the current interrupting relay 61, can improve.

Second Embodiment: Device Configuration

Figure 7:
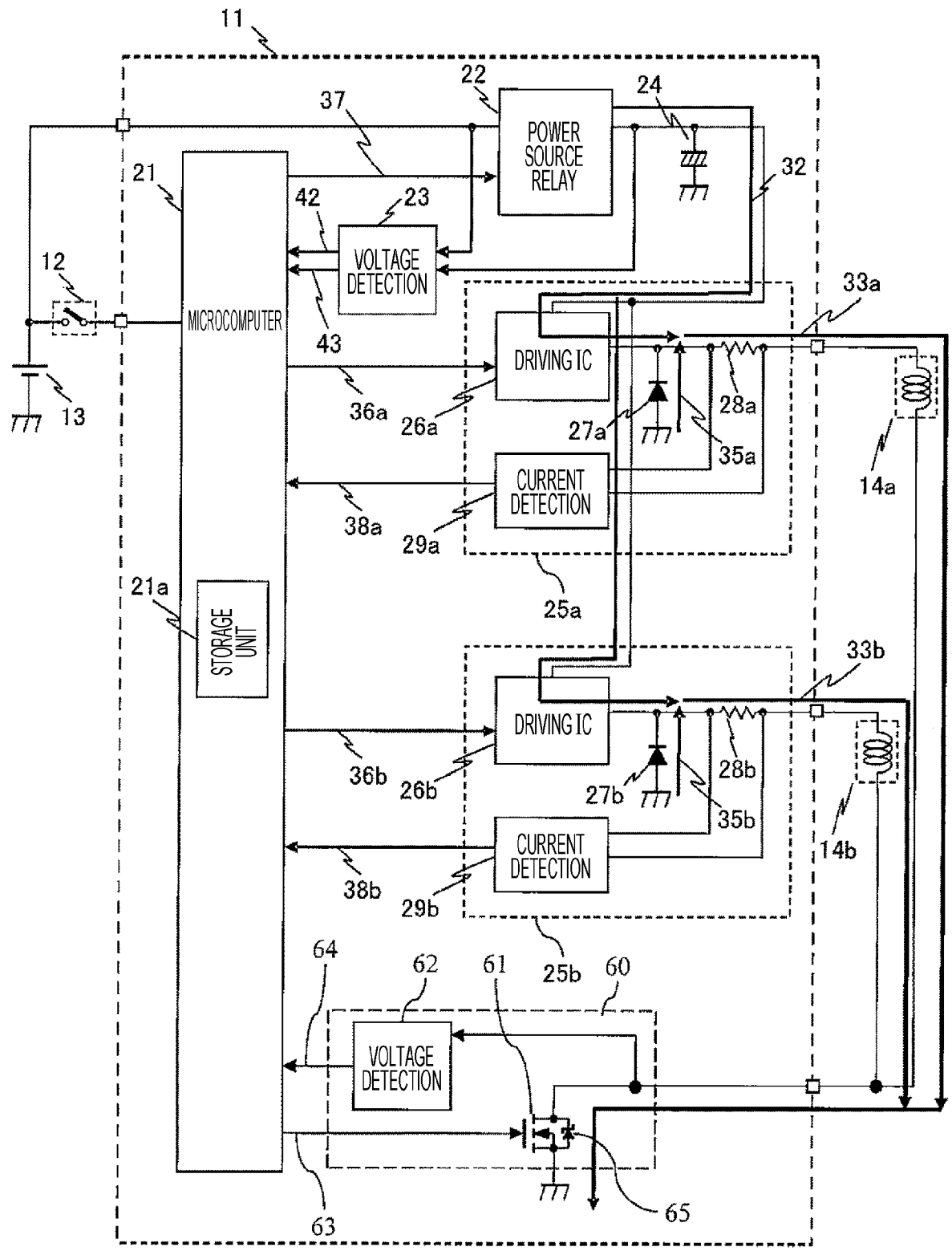
FIG. 7 is a circuit diagram of an ECU 11 according to a second embodiment.

FIG. 7 is a circuit diagram of an ECU 11 according to a second embodiment of the present invention. According to the second embodiment, the ECU 11 includes two load driving circuits 25. In order to distinguish the two, indices "a" and "b" are given to the load driving circuits 25 and the respective constituent elements thereof in FIG. 7. The load driving circuits 25 and the respective constituent elements will be distinguished below with the indices. The other constituent elements are similar to those according to the first embodiment, and thus differences will be mainly described below.

Second Embodiment: Device Operation

Figure 8:
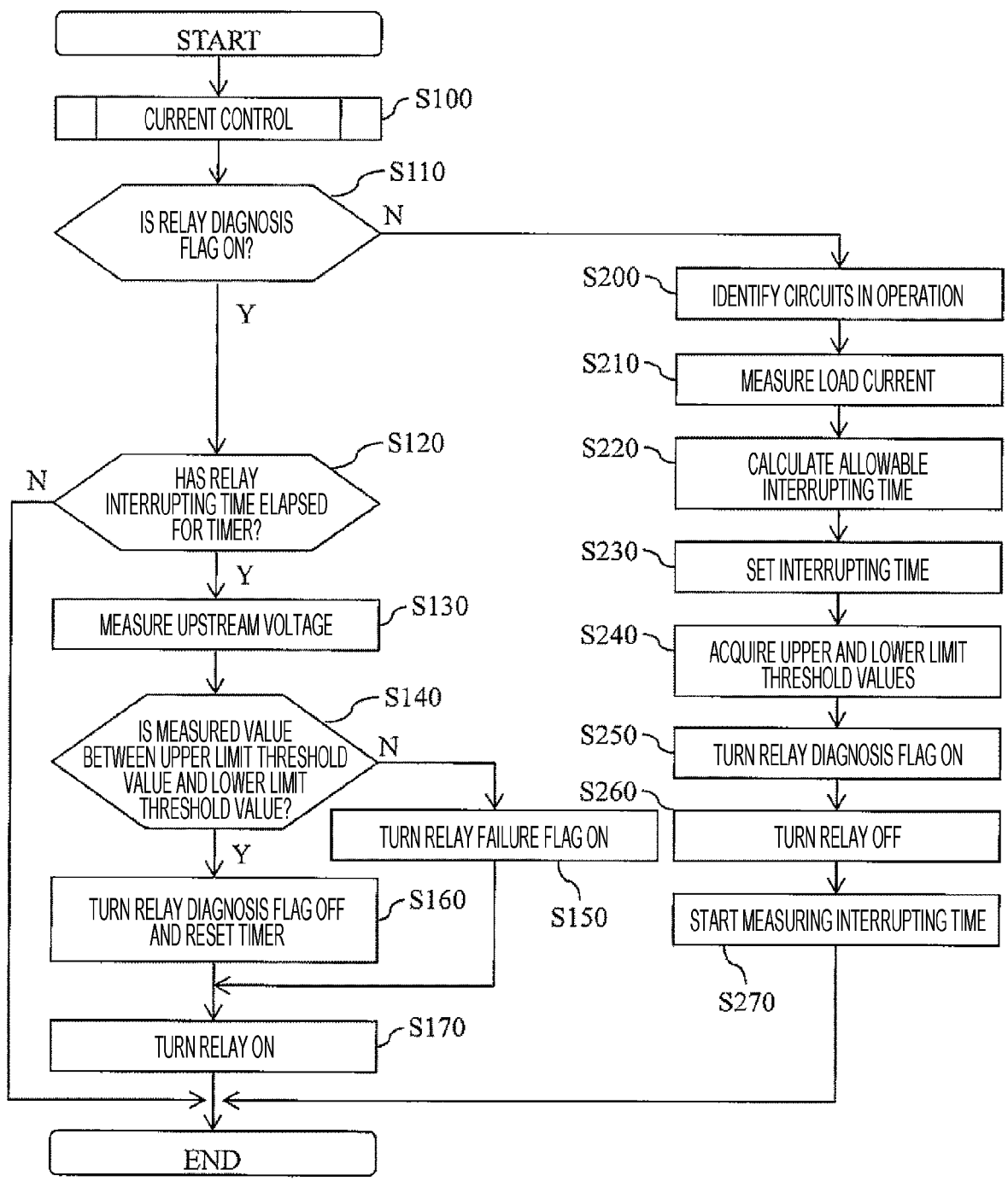
FIG. 8 is a flowchart for describing a procedure in which the ECU 11 performs failure diagnosis of a power source relay 22.

FIG. 8 is a flowchart for describing a procedure in which the ECU 11 performs failure diagnosis of a power source relay 22. Step S200 is newly added in comparison to FIG. 3. The other steps are similar to those in FIG. 3.

(FIG. 8: Step S200) A microcomputer 21 identifies the load driving circuits 25 in operation in order to check whether to perform the processing from S210 for an energizing current 32 in a case where the load driving circuits 25 are both in operation.

(FIG. 8: Step S200: Supplement)

When the present step is not performed, the energizing current 32 is measured without the checking of whether the load driving circuits 25 are in operation. Thus, at step S220, there is a possibility of calculating the allowable interrupting time with a current value different from an actually flowing current. In this case, there is a possibility of wrongly detecting a current interrupting relay 61 as having failed or there is a possibility of overlooking a failure of the current interrupting relay 61. Therefore, according to the second embodiment, the present step is provided in order to properly calculate the allowable interrupting time in accordance with the energizing current 32 actually flowing.

Figure 9:
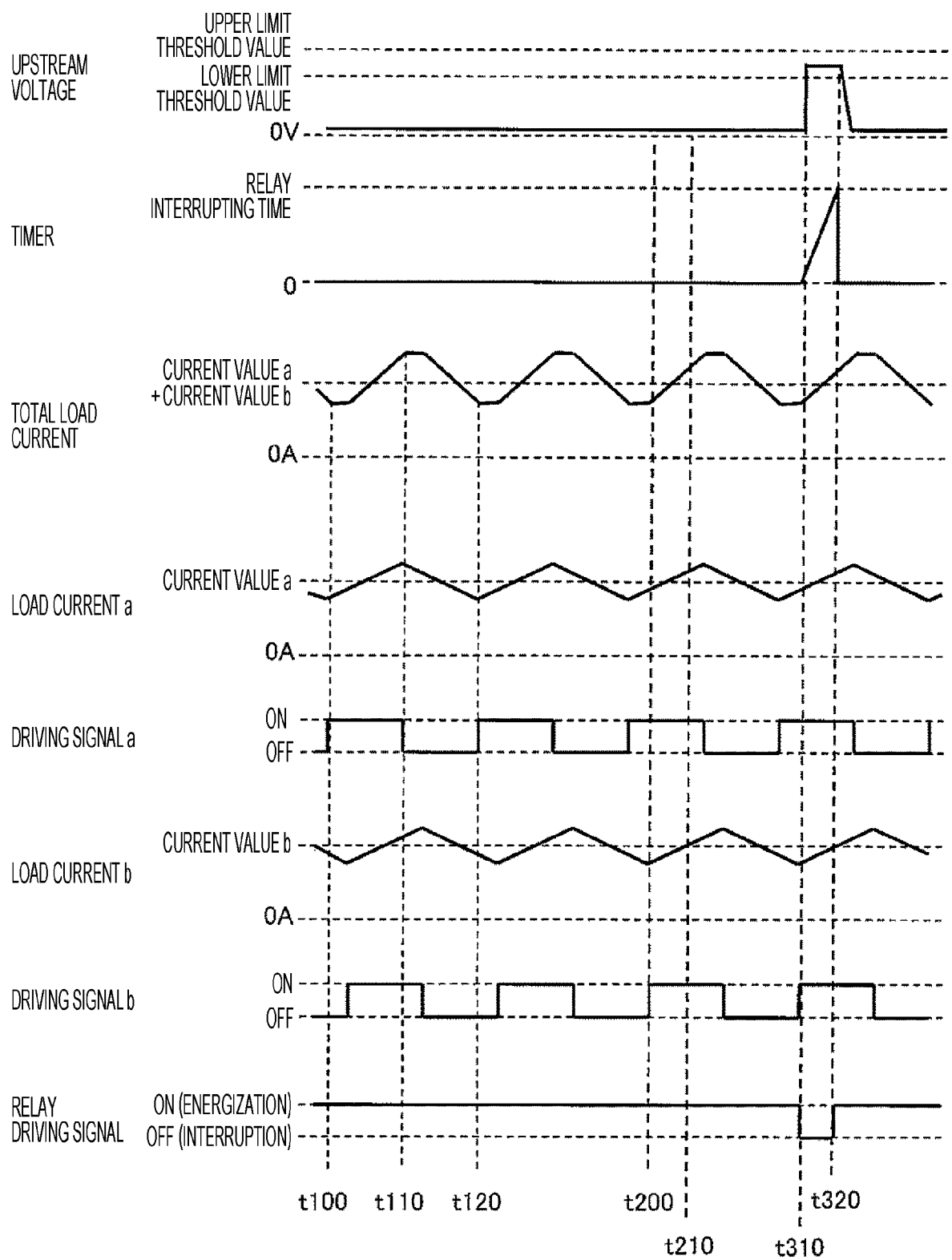
FIG. 9 is a timing chart for describing a process in which the ECU 11 performs failure diagnosis of a current interrupting relay 61.

FIG. 9 is a timing chart for describing a process in which the ECU 11 performs the failure diagnosis of the current interrupting relay 61. The process from time t100 to time t200 is similar to that according to the first embodiment. From time t200 to time t210, the microcomputer 21: identifies the load driving circuits 25 in operation; monitors a load current of each load driving circuit; calculates a total load current 33; and sets upper and lower limit threshold values of an upstream voltage 64. The time from time t310 to time t320 is a relay interrupting time set at step S230. The microcomputer 21 performs the failure diagnosis of the current interrupting relay 61 at time t320.

Second Embodiment: Effect

Similarly to that according to the first embodiment, the ECU 11 according to the second embodiment can perform the failure diagnosis of the current interrupting relay 61 without influence to the driving control precision of electromagnetic induction loads 14 even when the plurality of load driving circuits 25 is in operation.

According to the second embodiment, the ECU 11 including the two load driving circuits 25 has been described. However, even when the ECU 11 includes three load driving circuits 25 or more, a similar effect is acquired. According to the second embodiment, the failure diagnosis method of the current interrupting relay 61 in the case where the plurality of load driving circuits 25 is in operation, has been described. However, the ECU 11 including the plurality of load driving circuits 25 can perform the failure diagnosis of the current interrupting relay 61 even with one of the load driving circuits 25 in operation.

Third Embodiment

Figure 10:
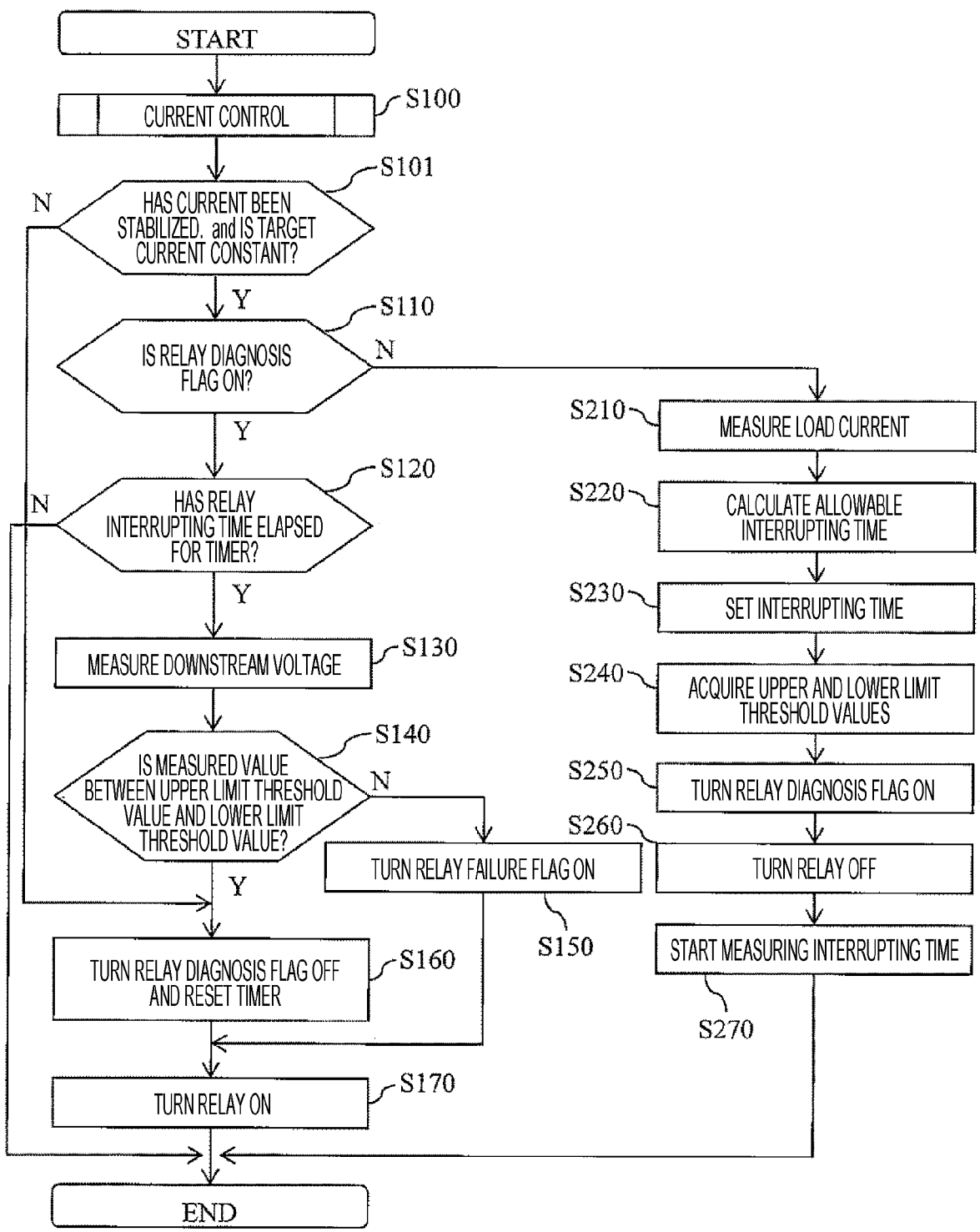
FIG. 10 is a flowchart for describing a procedure in which an ECU 11 according to a third embodiment performs failure diagnosis of a current interrupting relay 61.

FIG. 10 is a flowchart for describing a procedure in which an ECU 11 according to a third embodiment of the present invention performs failure diagnosis of a current interrupting relay 61. Step S101 is newly added in comparison to FIG. 3. The other steps are similar to those in FIG. 3. The configuration of the ECU 11 is similar to that according to the first embodiment.

(FIG. 10: Step S101)

A microcomputer 21 determines whether a target value of a load current 33 is constant and determines whether the load current 33 has been stabilized. When the target current value is constant and the load current 33 has been stabilized, the processing proceeds to step S110. When the target current value is not constant or when the load current 33 has not been stabilized, the processing skips to step S160. That is, the failure diagnosis of a power source relay 22 is interrupted in a state where the target current value is not constant or in a transient state where the load current 33 is not stabilized.

(FIG. 10: Step S101: Supplement 1)

The target value of the load current 33 may be changed during the operation. When the target value is changed, the microcomputer 21 controls the load current 33 toward the target value after the change. In a period during which the load current 33 has not been stabilized, immediately after the change of the target current value, the performance of the failure diagnosis of the current interrupting relay 61, may cause the following malfunction. When the actual load current 33 is smaller than a value used in calculating a relay interrupting time and upper and lower limit threshold values from steps S210 to S240, the actual risen amount of an upstream voltage 64 is smaller than the risen amount of the upstream voltage 64 considered at step S240, and thus the current interrupting relay 61 is wrongly detected as having failed. Meanwhile, when the actual load current 33 is larger than the value, even when the current interrupting relay 61 is interrupted within an allowable range for the control precision of an energizing current 32, there is a possibility that the control precision is not in the allowable range. At step S101, the failure wrong-detection or the degradation of the control precision can be avoided.

(FIG. 10: Step S101: Supplement 2)

It can be determined whether the load current 33 has been stabilized, for example, on the basis of whether the load current 33 has converged in a range of 95% to 105% to the target current. The determination may be made in accordance with any appropriate rule.

Figure 11:
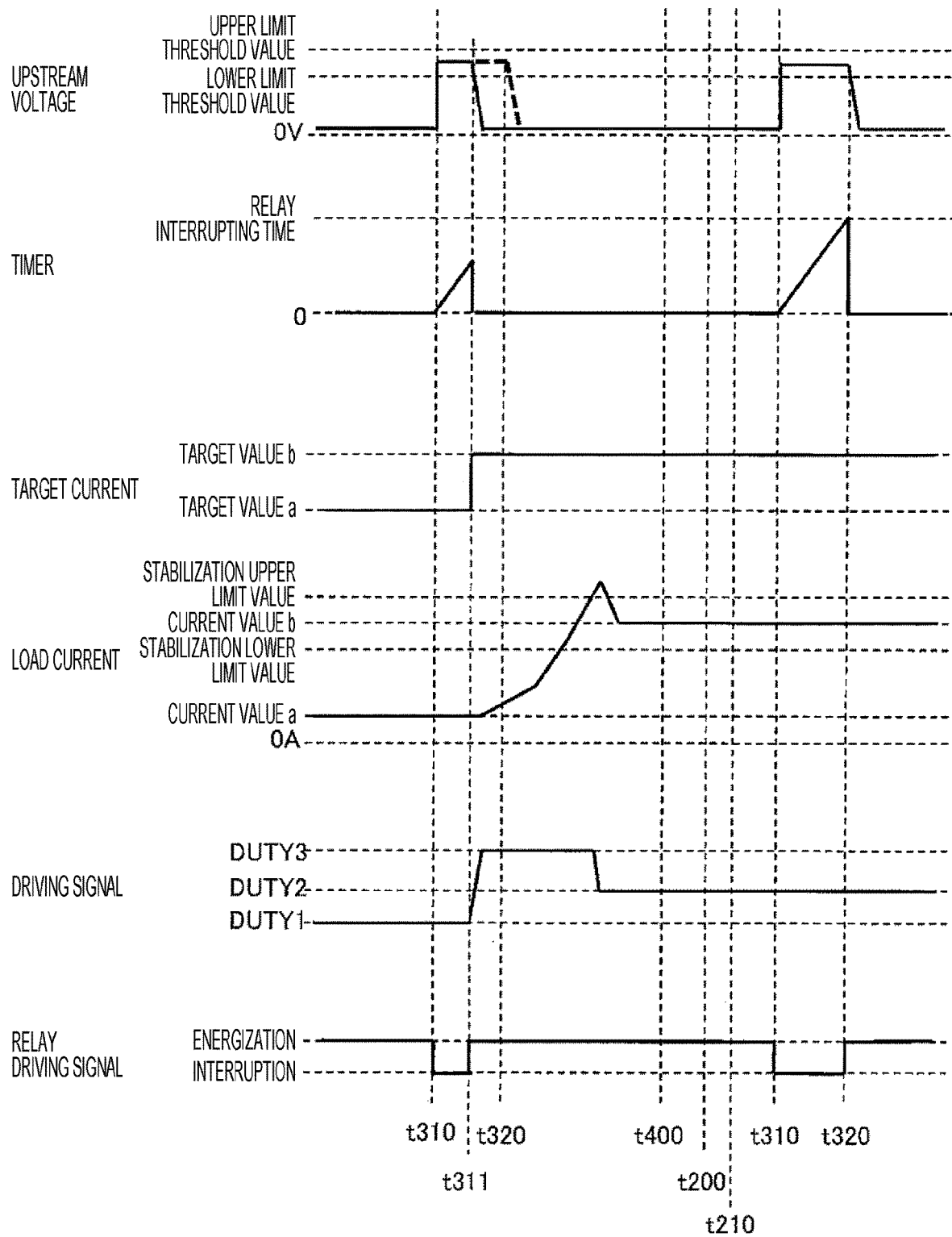
FIG. 11 is a timing chart for describing a process in which the ECU 11 performs the failure diagnosis of the current interrupting relay 61.

FIG. 11 is a timing chart for describing a process in which the ECU 11 performs the failure diagnosis of the current interrupting relay 61. The load current 33 and a driving signal 36 have sawtooth waves and square waves, respectively, but FIG. 11 schematically illustrates straight lines for the waves.

The microcomputer 21 turns the current interrupting relay 61 off at time t310 to start the failure diagnosis. It is assumed that the target current value is switched from a target value a to a target value b at time t311. The period from time t311 to time t400 corresponds to a state where the target current value varies and the load current 33 is not stabilized. The microcomputer 21 interrupts the failure diagnosis of the current interrupting relay 61 in the period.

The period after time t400 corresponds to a state where the target current value is constant and the load current 33 is stabilized. The microcomputer 21 can perform the failure diagnosis of the current interrupting relay 61 in the period. The microcomputer 21 performs the processing from steps S210 to S240 from time t200 to time t210, similarly to FIG. 5. The microcomputer 21 performs the failure diagnosis, maintaining the current interrupting relay 61 off from time t310 to time t320, similarly to FIG. 5.

Third Embodiment: Effect

The ECU 11 according to the third embodiment, interrupts the failure diagnosis of the current interrupting relay 61 while the load current 33 transiently varying. This arrangement can avoid the failure wrong-detection or the degradation of the driving control precision of an electromagnetic induction load 14. The configuration and the operation according to the third embodiment, can be applied to, for example, the second embodiment.

Fourth Embodiment

Figure 12:
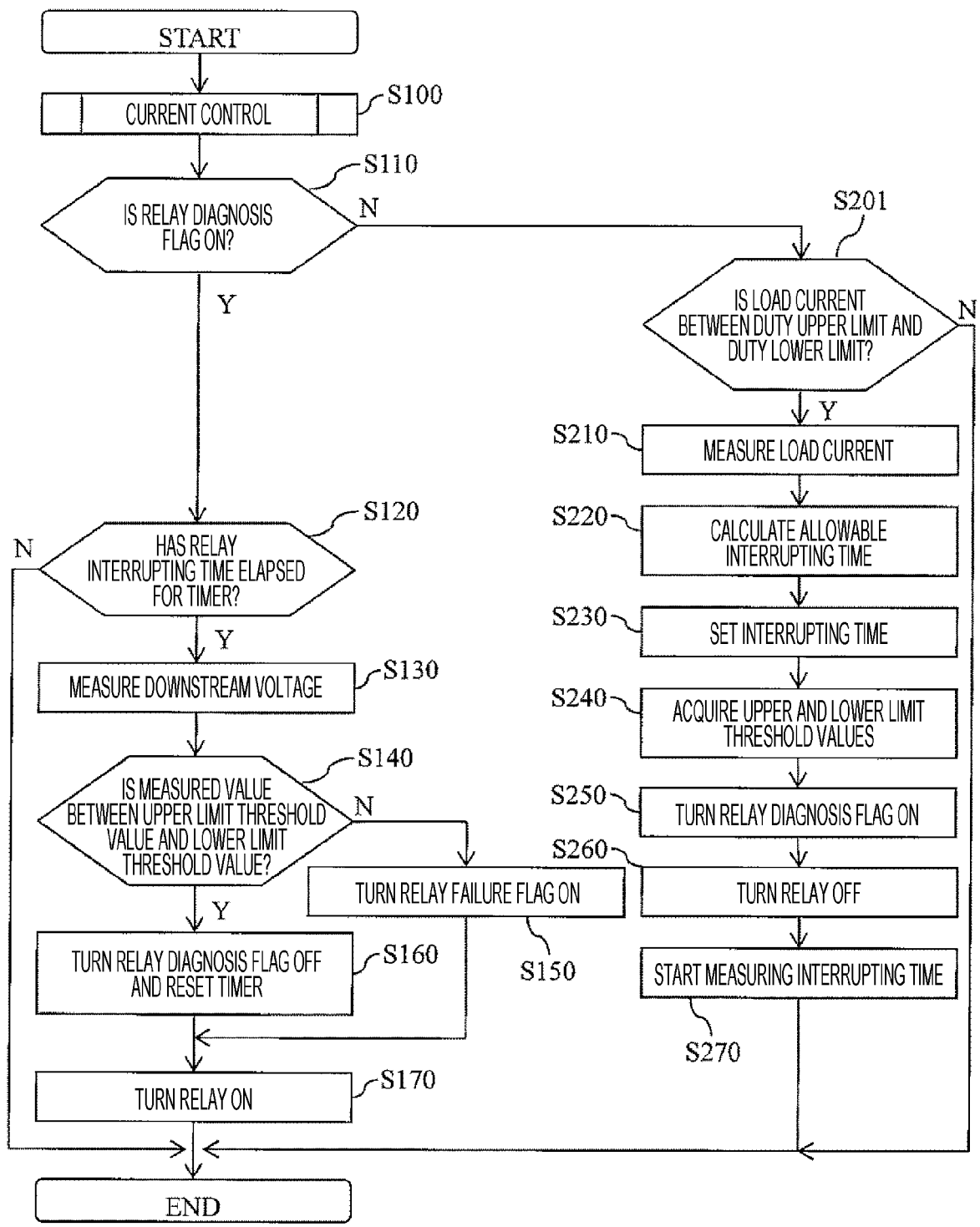
FIG. 12 is a flowchart for describing a procedure in which an ECU 11 according to a fourth embodiment performs failure diagnosis of a current interrupting relay 61.

FIG. 12 is a flowchart for describing a procedure in which an ECU 11 according to a fourth embodiment of the present invention performs failure diagnosis of a current interrupting relay 61. Step S201 is newly added in comparison to FIG. 3. The other steps are similar to those in FIG. 3. The configuration of the ECU 11 is similar to that according to the first embodiment.

(FIG. 12: Step S201)

A microcomputer 21 checks whether the duty of a driving signal 36 causes no influence to the driving control precision of an electromagnetic induction load 14 even when the current interrupting relay 61 is interrupted. That is, it is determined whether the duty of the driving signal 36 is between a duty upper limit value and a duty lower limit value. When the duty of the driving signal 36 is not between the duty upper limit value and the duty lower limit value, the present flowchart finishes. When the duty of the driving signal 36 is between the duty upper limit value and the duty lower limit value, the processing proceeds to step S210. The addition of step S201 can avoid failure overlook to be described below and degradation of the load driving control precision.

(FIG. 12: Step S201: Supplement 1)

When an energizing current 32 is sufficiently small, namely, the duty of the driving signal 36 is low, an upstream voltage 64 does not rise sufficiently even when the current interrupting relay 61 is turned off. Therefore, it cannot be properly determined whether the insufficient rise of the upstream voltage 64 is due to a short-failure of the current interrupting relay 61. That is, even when the current interrupting relay 61 has short-failed, it cannot be properly determined whether the failure has occurred, and thus there is a possibility of overlooking the failure.

(FIG. 12: Step S201: Supplement 2)

When the energizing current 32 is sufficiently large, namely, the duty of the driving signal 36 is high, an allowable interrupting time of the current interrupting relay 61 is excessively short (refer to FIG. 5). On the other hand, energization and interruption of the current interrupting relay 61 are controlled with a current interrupting signal 63, but the current interrupting signal includes a degree of lag.

Even when the current interrupting signal 63 is set in an interrupted state within the time lag, the state of the current interrupting relay 61 does not vary. That is, when the allowable interrupting time is excessively short, the current interrupting relay 61 cannot be interrupted as expected, and thus there is a possibility that the upstream voltage 64 does not rise sufficiently. In this case, even when the current interrupting relay 61 is normal, the current interrupting relay 61 is misdiagnosed as having failed.

Figure 13:
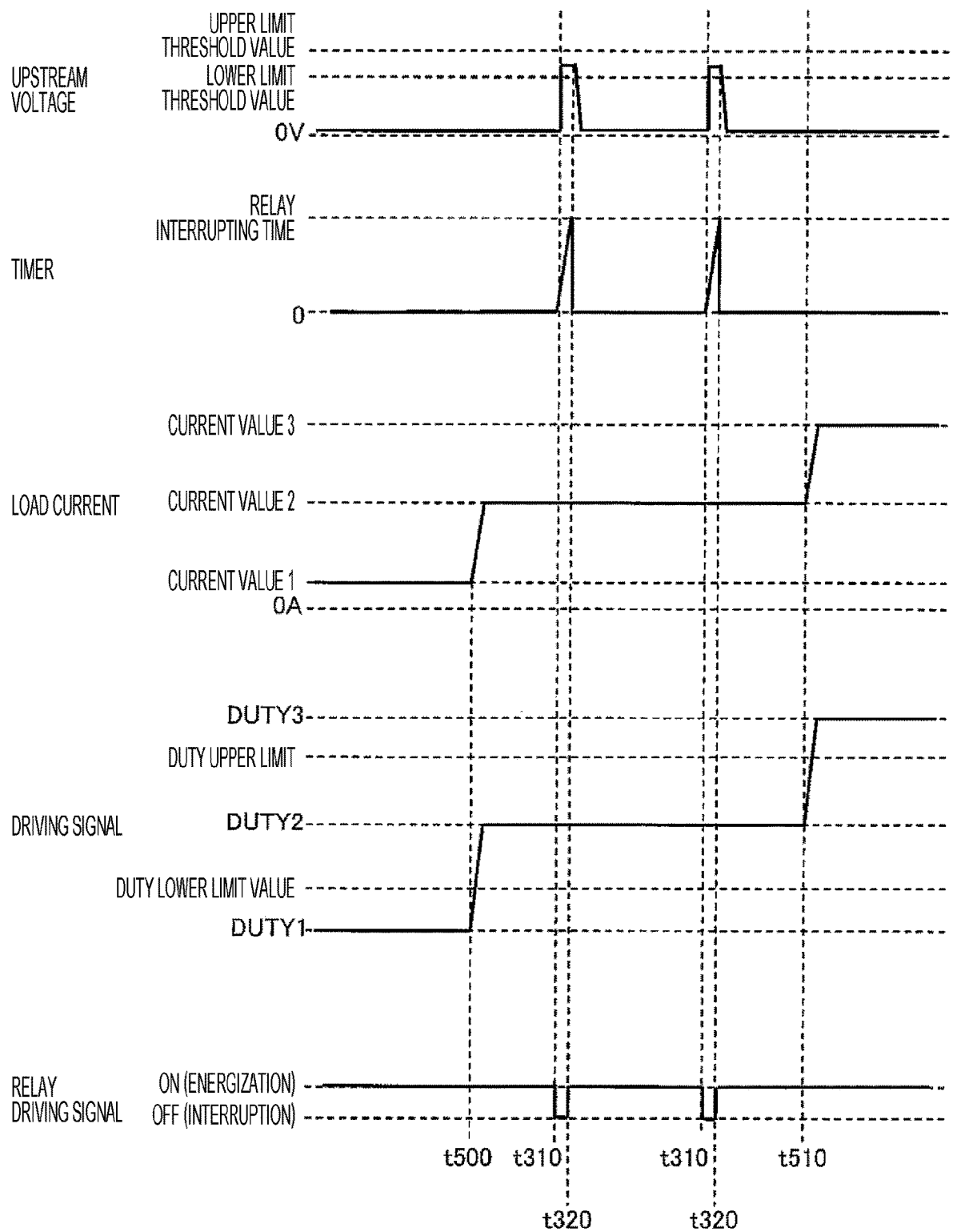
FIG. 13 is a timing chart for describing a process in which the ECU 11 performs the failure diagnosis of the current interrupting relay 61.

FIG. 13 is a timing chart for describing a process in which the ECU 11 performs the failure diagnosis of the current interrupting relay 61. A load current 33 and the driving signal 36 have sawtooth waves and square waves, respectively, but FIG. 13 schematically illustrates straight lines for the waves.

The driving signal 36 is the duty lower limit value or less before time t500, and thus the microcomputer 21 does not perform the failure diagnosis of the current interrupting relay 61 in the period. The driving signal 36 is the duty upper limit value or more after time t510, and thus the microcomputer 21 does not perform the failure diagnosis of the current interrupting relay 61 in the period. The duty of the driving signal 36 is between the duty upper limit value and the duty lower limit value during the period from time t500 to time t510, and thus the microcomputer 21 performs the failure diagnosis of the current interrupting relay 61 during the period.

Fourth Embodiment: Effect

The ECU 11 according to the fourth embodiment, can (a) inhibit the possibility of overlooking the failure of the current interrupting relay 61 when the energizing current 32 is sufficiently small and additionally can (b) inhibit the possibility of wrongly detecting the current interrupting relay 61 as having failed when the energizing current 32 is sufficiently large. The configuration and the operation according to the fourth embodiment, can be also applied to, for example, the second embodiment.

Fifth Embodiment

Figure 14:
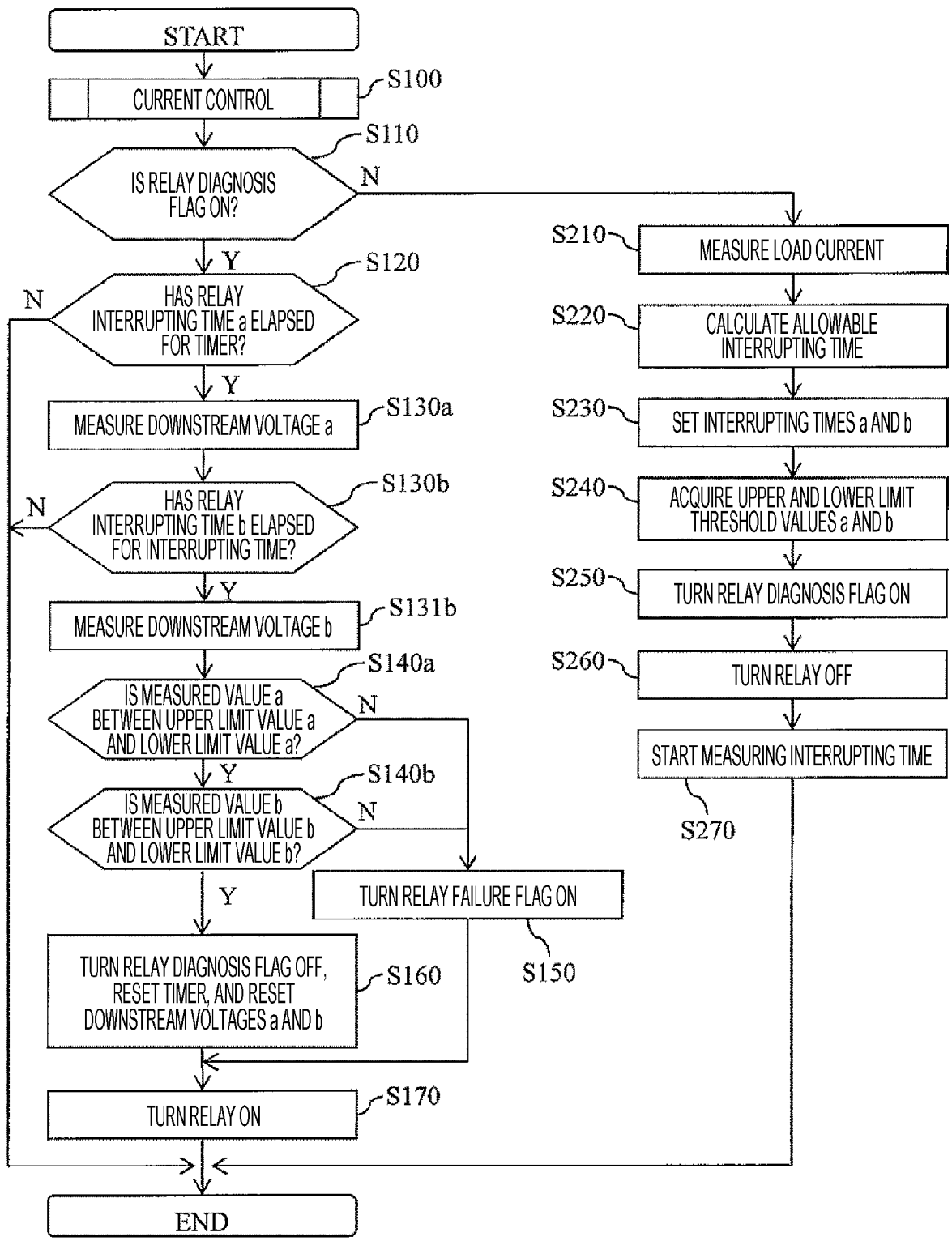
FIG. 14 is a flowchart for describing a procedure in which an ECU 11 according to a fifth embodiment performs failure diagnosis of a current interrupting relay 61.

FIG. 14 is a flowchart for describing a procedure in which an ECU 11 according to a fifth embodiment of the present invention performs failure diagnosis of a current interrupting relay 61. Alterations have been made for steps S120 to S140b and steps S230 and S240 in comparison to FIG. 3. The configuration of the ECU 11 is similar to that according to the first embodiment.

(FIG. 14: Step S230)

A microcomputer 21 sets a relay interrupting time a and a relay interrupting time b. The relay interrupting time a is set shorter than the relay interrupting time b. The relay interrupting time b is a time during which the current interrupting relay 61 is actually being interrupted (similar to the relay interrupting time according to the first embodiment).

(FIG. 14: Step S240)

The microcomputer 21 calculates the risen voltage amount a of an upstream voltage 64a, on the basis of the relay interrupting time a. The microcomputer 21 calculates the risen voltage amount b of an upstream voltage 64b, on the basis of the relay interrupting time b. The microcomputer 21 further sets upper limit threshold values a and b and lower limit threshold values a and b corresponding to the risen voltage amounts a and b, respectively. The upper and lower limit threshold values a and the upper and lower limit threshold values b may be identical to each other or the ranges may partially overlap each other. The distinction between downstream voltages 64a and 64b will be described later.

(FIG. 14: Step S120)

The microcomputer 21 determines whether the relay interrupting time a has elapsed after turning the current interrupting relay 61 off. When the relay interrupting time a has not elapsed, the present flowchart finishes, and thus the diagnosis processing of the current interrupting relay 61 from step S130a is not performed. When the relay interrupting time a has elapsed, the processing proceeds to step S130a.

(FIG. 14: Step S130a)

The microcomputer 21 determines whether the upstream voltage 64a has been already measured. When the upstream voltage 64a has not been measured, the microcomputer 21 measures the upstream voltage 64a. The upstream voltage 64 is measured twice in the present flowchart, and thus indices a and b are used in order to distinguish the two.

(FIG. 14: Step S130b)

The microcomputer 21 determines whether the relay interrupting time b has elapsed after the turning off of the current interrupting relay 61. When the relay interrupting time b has not elapsed, the present flowchart finishes, and thus the diagnosis processing of the current interrupting relay 61 from step S131b is not performed. When the relay interrupting time b has elapsed, the processing proceeds to step S131b.

(FIG. 14: Step S130b)

The microcomputer 21 measures the upstream voltage 64b.

(FIG. 14: Steps S140a and S140b)

The microcomputer 21 determines whether the upstream voltage 64a is between the upper limit threshold value a and the lower limit threshold value a (S140a). The microcomputer 21 determines whether the upstream voltage 64b is between the upper limit threshold value b and the lower limit threshold value b (S140b). When the determining condition at either step S140a or step S140b is not satisfied, the processing proceeds to step S150. When the determining conditions at both step S140a and step S140b are satisfied, the processing proceeds to step S160

(FIG. 14: Step S160)

The microcomputer 21 resets a relay diagnosis flag and a timer and additionally resets the upstream voltages 64a and 64b.

Figure 15:
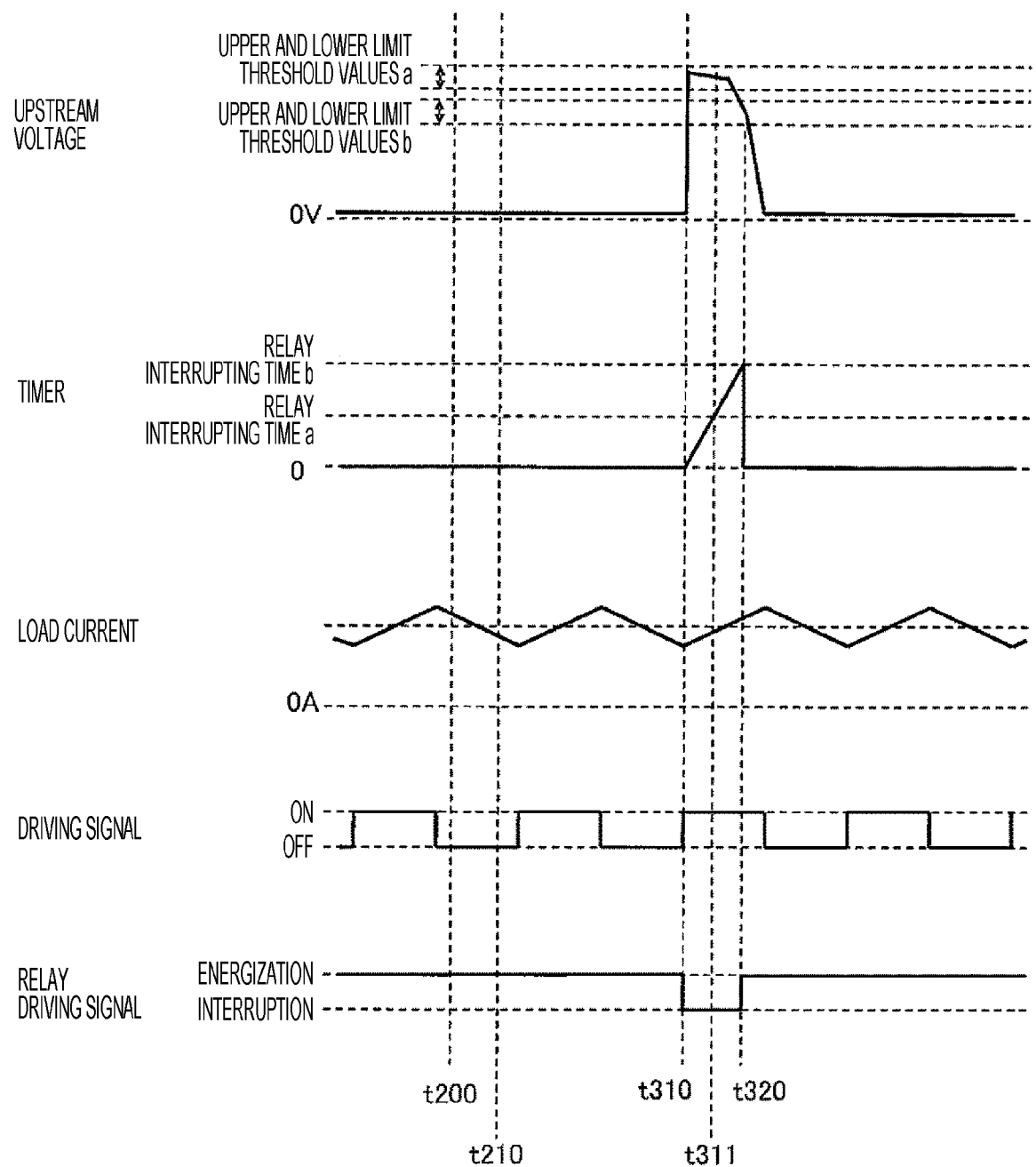
FIG. 15 is a timing chart for describing a process in which the ECU 11 performs the failure diagnosis of the current interrupting relay 61.

FIG. 15 is a timing chart for describing a process in which the ECU 11 performs the failure diagnosis of the current interrupting relay 61. The current interrupting relay 61 is off during the period from time t310 and time t320. Time t310 corresponds to the relay interrupting time a, and time t320 corresponds to the relay interrupting time b. The microcomputer 21 measures the upstream voltage 64a at time t311. The microcomputer 21 measures the upstream voltage 64b at time t320. The microcomputer 21 determines whether the upstream voltage 64 is between the upper and lower limit threshold values a at time t311 and between the upper and lower limit threshold values b at time t320.

Fifth Embodiment: Effect

According to the first embodiment, in performing the failure diagnosis of the current interrupting relay 61 with the current interrupting relay 61 having short-failed, the upstream voltage 64 of the current interrupting relay 61 may vary to be in the range between the upper and lower limit threshold values. Thus, although the current interrupting relay 61 has short-failed, the microcomputer 21 misdiagnoses that the current interrupting relay 61 is normal. In contrast to this, even in a case where the current interrupting relay 61 has short-failed, the ECU 11 according to the fifth embodiment monitors the upstream voltage 64 of the current interrupting relay 61 a plurality of times, and determines that the current interrupting relay 61 has failed, when detecting that the upstream voltage 64 is outside the range between the upper and lower limit threshold values, at least once. This arrangement can avoid the misdiagnosis due to the phenomenon. The configuration and the operation according to the sixth embodiment can be applied to, for example, the second embodiment. Even when the relay interrupting time a according to the sixth embodiment is plurally set, a similar effect is acquired.

Sixth Embodiment

Figure 16:
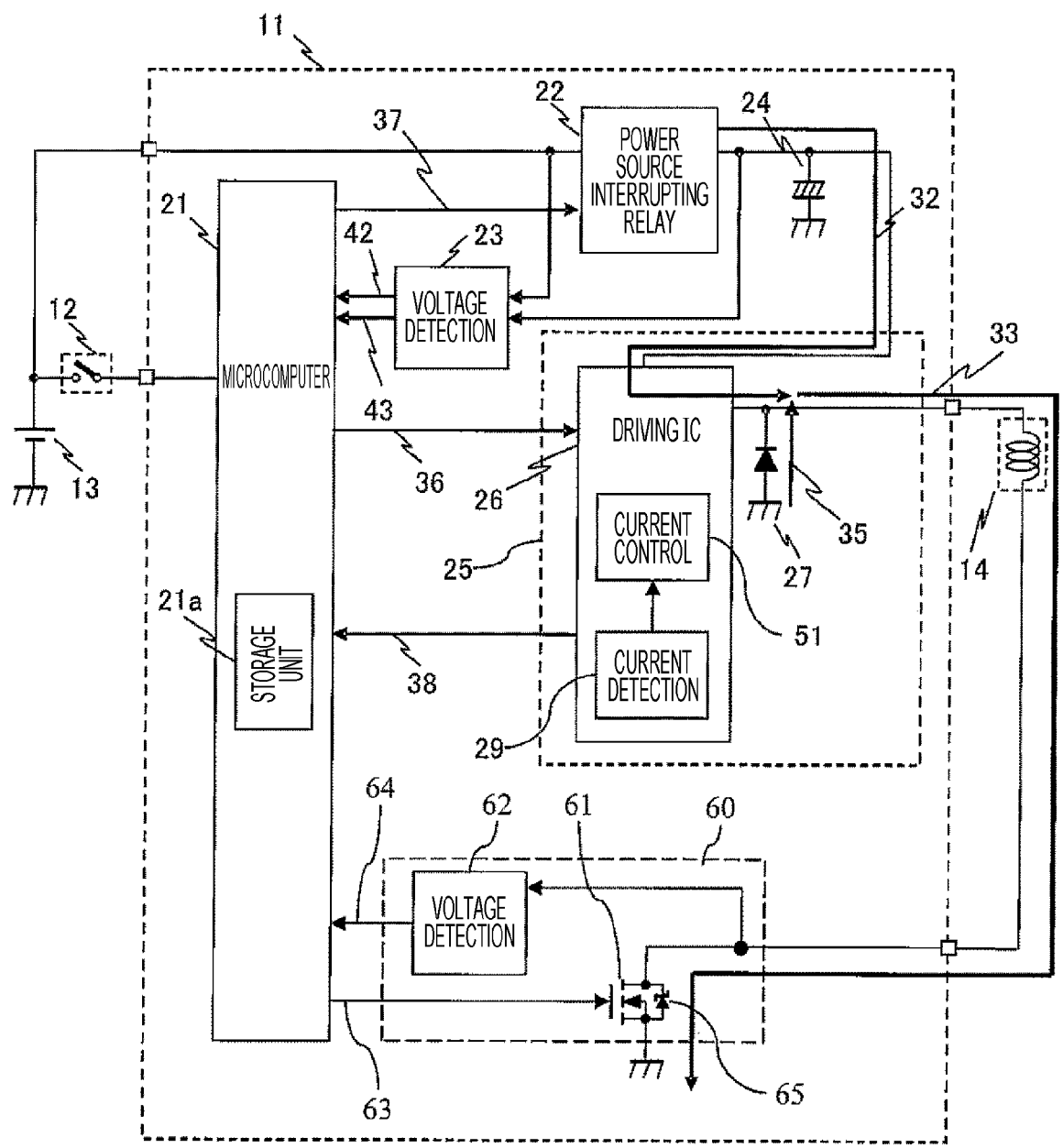
FIG. 16 is a circuit diagram of an ECU 11 according to a sixth embodiment.

FIG. 16 is a circuit diagram of an ECU 11 according to a sixth embodiment of the present invention. According to the sixth embodiment, a driving IC 26 includes a current detecting unit 29 as a part. A current control unit 51 included in the driving IC 26 performs processing of controlling a load current 33. The circuit configuration can acquire an effect similar to that according to the first embodiment. Even when a plurality of load driving circuits 25 is provided similarly to the second embodiment, a similar effect can be acquired.

Seventh Embodiment

Figure 17:
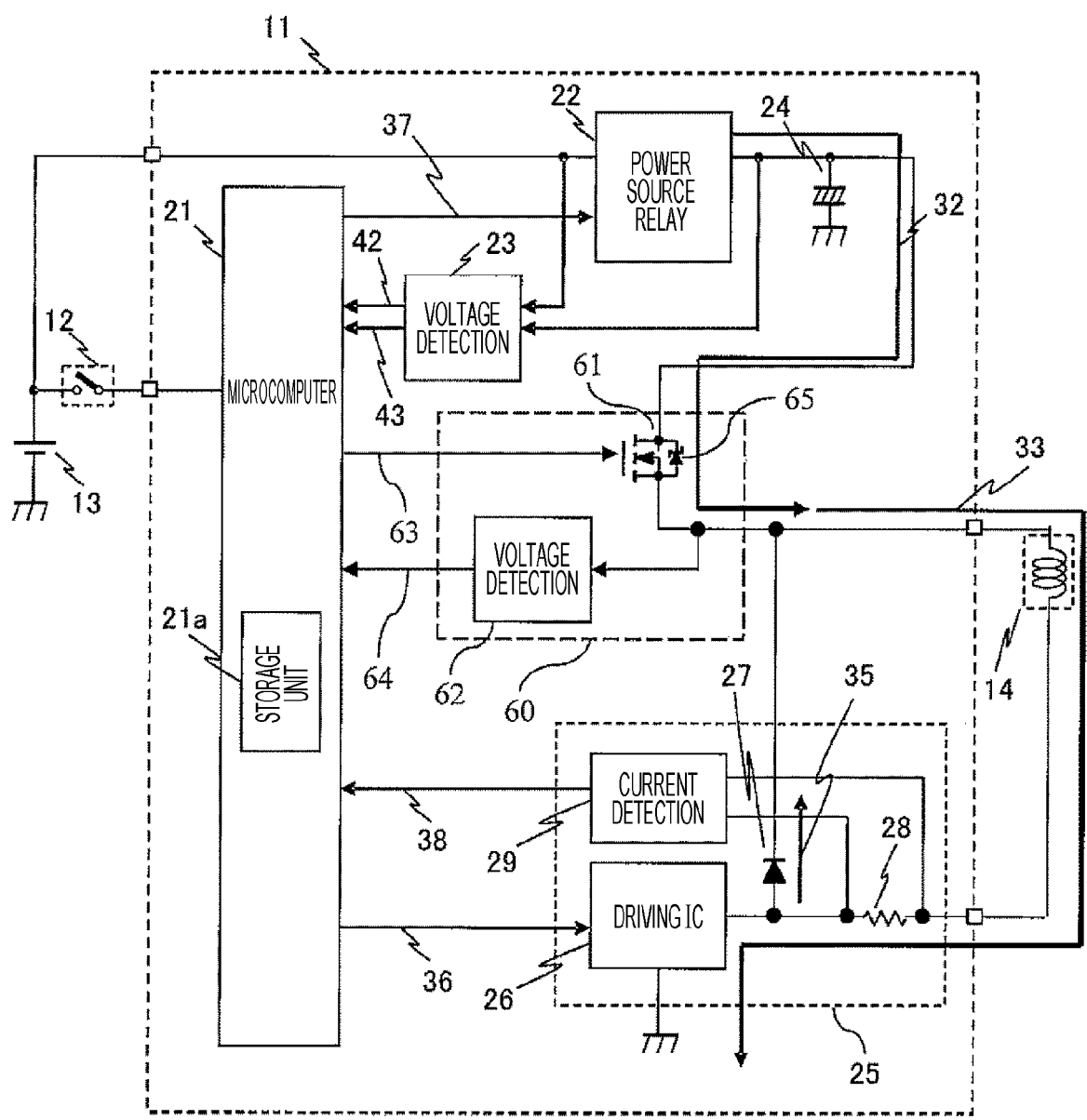
FIG. 17 is a circuit diagram of an ECU 11 according to a seventh embodiment.

FIG. 17 is a circuit diagram of an ECU 11 according to a seventh embodiment of the present invention. The ECU according to the seventh embodiment, includes a load driving circuit 25 and an interrupting circuit 60 replaced with each other in position in comparison to those according to the first embodiment. That is, the load driving circuit 25 is disposed on the downstream side of an electromagnetic induction load 14, and the interrupting circuit 60 is disposed on the upstream side of the electromagnetic induction load 14. Differences from the first embodiment due to the replacement, will be described below.

A load current 33 flows from the downstream side of the electromagnetic induction load 14 to the load driving circuit 25, and then flows toward a ground through a driving IC 26. A current detecting unit 29 detects the current input to the driving IC 26.

A current interrupting relay 61 interrupts an energizing current 32 on the upstream side of the electromagnetic induction load 14. When the load driving circuit 25 is in energization and the current interrupting relay 61 is in interruption, the load current attempts to continue flowing and a counter electromotive voltage (surge voltage) occurs downstream from the current interrupting relay 61, so that a downstream voltage 64 reaches approximately the ground or less. Therefore, upper and lower limit threshold values to be set at step S240 are required to be determined in accordance with a voltage characteristic in that case. A voltage detecting unit 62 monitors the downstream voltage 64 of the current interrupting relay 61, to output a result of the monitoring to a microcomputer 21.

Figure 18:
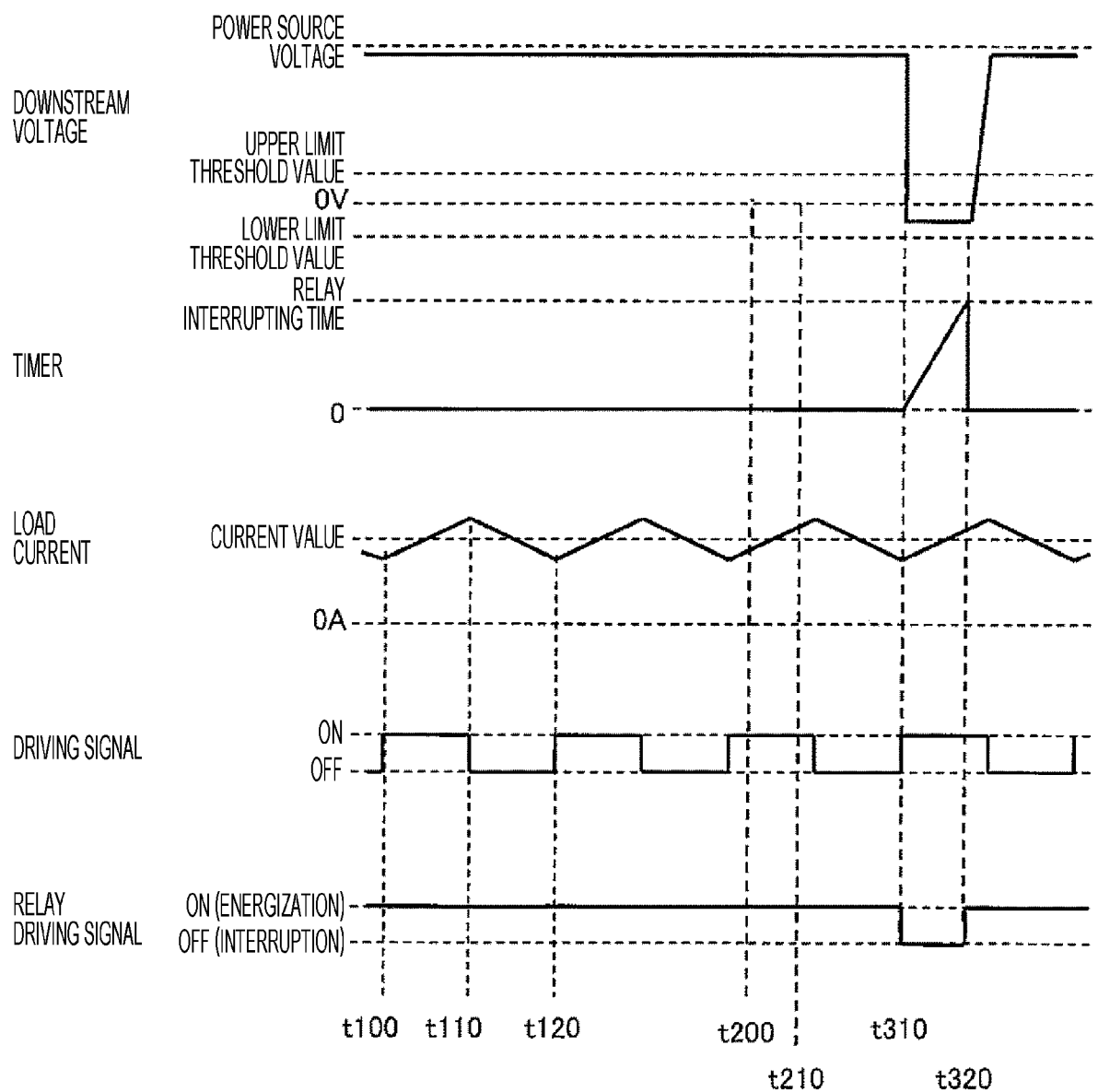
FIG. 18 is a timing chart for describing a process in which the ECU 11 performs failure diagnosis of a current interrupting relay 61.

FIG. 18 is a timing chart for describing a process in which the ECU 11 performs failure diagnosis of the current interrupting relay 61. The diagnosis procedure is almost similar to that according to the first embodiment. Note that, differently from the first embodiment, since the downstream voltage 64 falls to approximately the ground or less while the current interrupting relay 61 is in interruption, the upper and lower limit threshold values are set in the neighborhood of the fall.

Eighth Embodiment

In the first to seventh embodiments, the description in which the upstream voltage 64 is measured at the elapse of the relay interrupting time after the interruption of the current interrupting relay 61, has been given. Instead of the arrangement, an ECU 11 according to an eighth embodiment of the present invention, detects a rise edge and a fall edge in voltage detected by a voltage detecting unit 23, to determine timing for measurement of an upstream voltage 64. The other arrangements are similar to those according to the first to seventh embodiments, and thus differences relating to the edge detection will be mainly described below.

Figure 19:
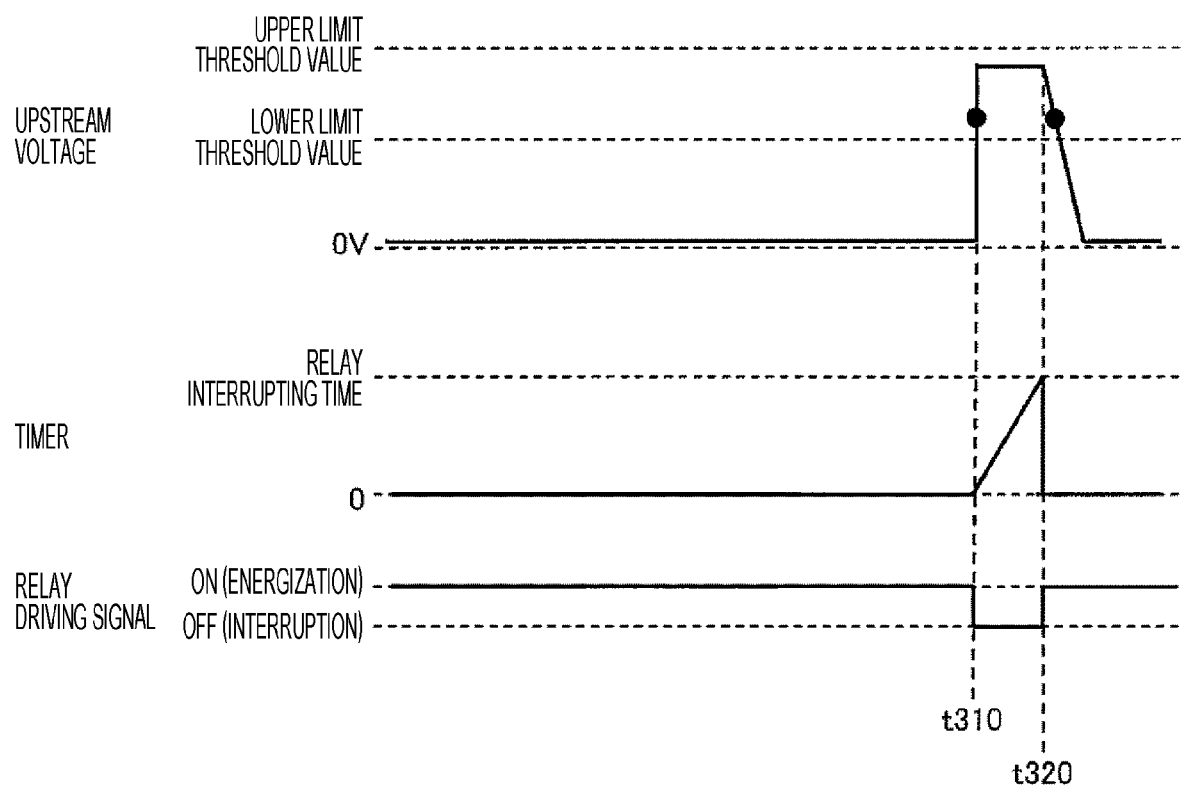
FIG. 19 is a timing chart for describing a process in which an ECU 11 according to an eighth embodiment performs failure diagnosis of a current interrupting relay 61.

FIG. 19 is a timing chart for describing a process in which the ECU 11 according to the eighth embodiment performs failure diagnosis of a current interrupting relay 61. For the convenience of descriptions, only part of the signal waveforms described in the first embodiment have been illustrated.

When the current interrupting relay 61 is turned off, the upstream voltage 64 rapidly rises. A microcomputer 21 detects the rise edge to check whether the upstream voltage 64 is an upper limit threshold value or less. After that, when the current interrupting relay 61 is turned on, the upstream voltage 64 rapidly falls. The microcomputer 21 detects the fall edge to check whether the upstream voltage is a lower limit threshold value or more. When the upstream voltage 64 has the edges both in the range of the threshold values, it can be diagnosed that the current interrupting relay 61 is normal. When at least either of the edges is out of the range, it can be diagnosed that the current interrupting relay 61 is abnormal.

In order to perform the diagnosis procedure, at least (a) a step of acquiring the upstream voltage 64 with the detection of the rise edge of the upstream voltage 64 and (b) a step of acquiring the upstream voltage 64 with the detection of the fall edge of the upstream voltage 64, are performed and then the processing from step S140 is performed, instead of steps S120 and S130 described in FIG. 3.

While the current interrupting relay 61 is in interruption, the microcomputer 21 diagnoses the current interrupting relay 61, on the basis of whether the upstream voltage 64 is in the range between the upper and lower limit threshold values. Therefore, when the point of the detection of the rise edge is out of the period during which the current interrupting relay 61 is in interruption, the flowchart of FIG. 3 finishes. Abnormality diagnosis in this case is performed by a procedure different from that of FIG. 3.

When the point of the detection of the fall edge of the upstream voltage 64 considerably deviates from the point at which the current interrupting relay 61 is turned on or is before the current interrupting relay 61 is turned on, the flowchart of FIG. 3 finishes and then diagnosis is performed by a different procedure. The microcomputer 21 can check the above, for example, on the basis of whether the time interval between time t320 and the fall edge is in a predetermined range.

The rise and fall edge of the upstream voltage 64 have been described above. However, when the current interrupting relay 61 is disposed on the upstream side of an electromagnetic induction load 14 as described in the seventh embodiment, a fall edge and a rise edge of a downstream voltage 64 are detected and then failure diagnosis is performed to each of the edges similarly to the procedure.

Modification of Present Invention

The present invention is not limited to the embodiments, and thus includes various modifications. For example, the embodiments have been described in detail in order to easily understand the present invention. The present invention is not necessarily limited to including all the configurations described above. Part of the configuration in one embodiment can be replaced with the configuration in another embodiment. In addition, the configuration in one embodiment can be added to the configuration in another embodiment. For part of the configuration in each embodiment, additions, deletions, and replacements of the other configurations may be made.

In the embodiments, the detecting units, such as the voltage detecting unit 23, the current detecting unit 29, and the voltage detecting unit 62 can be implemented with hardware, such as a circuit device, that achieves the functions thereof, but similar functions may be implemented instead of this.

In the embodiments, the microcomputer 21 diagnoses the current interrupting relay 61 with the detected result of the voltage detecting unit 62, but can also detect a different abnormality in the path of the energizing current 32, with the detected result. For example, no surge voltage occurs when part of the energizing path has a break, and thus a break failure can be detected on the basis of this.

The description in which the rise edge and the fall edge are detected, has been given in the eighth embodiment. For example, when having an identical function implemented by hardware, the microcomputer 21 can use the function. When the microcomputer 21 does not have the identical function, a similar function may be implemented by software processing or edge detection may be implemented by any appropriate circuit device.

The ECU 11 of the vehicle automatic transmission has been described in the embodiments, but the present invention is not limited to the vehicle automatic transmission. Even when the present invention is applied to a vehicle control device having a similar circuit configuration for driving an electromagnetic induction load (e.g., engine control device), a similar effect can be acquired.

REFERENCE SIGNS LIST

11 ECU
14 electromagnetic induction load
21 microcomputer
22 power source relay
23 voltage detecting unit
24 capacitor
25 load driving circuit
27 freewheeling diode
32 energizing current
33 load current
35 freewheeling current
61 current interrupting relay
62 voltage detecting unit
65 voltage limiting element

The invention claimed is:

1. An electromagnetic load driving device configured to drive an electromagnetic induction load, the electromagnetic load driving device comprising:

a first switch configured to control an energizing current to be supplied to the electromagnetic induction load;

a second switch connected to the electromagnetic induction load in series, the second switch being configured to switch between interruption and energization of the energizing current;

a voltage detecting unit configured to detect a voltage between the second switch and the electromagnetic induction load; and a computing unit configured to diagnose whether an energizing path of the energizing current is normal, based on a surge voltage detected by the voltage detecting unit when the second switch interrupts the energizing current during the control of the energizing current by the first switch.

2. The electromagnetic load driving device according to claim 1, wherein the computing unit diagnoses whether the second switch is normal, based on the surge voltage.

3. The electromagnetic load driving device according to claim 2, wherein the computing unit diagnoses that the second switch is normal when the surge voltage is in a range between predetermined upper and lower limit voltage values, and the computing unit diagnoses that the second switch is abnormal when the surge voltage is out of the range between the predetermined upper and lower limit voltage values.

4. The electromagnetic load driving device according to claim 1, further comprising a storage unit configured to store data indicating a correspondence between a quantity of the energizing current and an allowable interrupting time of the second switch during which a variation width from a target current of the energizing current during the interruption of the second switch, is allowed to be in a predetermined range,
wherein the computing unit causes the second switch to interrupt the energizing current during a time within the allowable interrupting time.

5. The electromagnetic load driving device according to claim 4, further configured to drive a plurality of the electromagnetic induction loads, wherein the computing unit causes the second switch to interrupt the energizing current, in accordance with the allowable interrupting time corresponding to the quantity of the energizing current supplied to an electromagnetic induction load drived by the electromagnetic load driving device from the plurality of the electromagnetic induction loads.

6. The electromagnetic load driving device according to claim 1, wherein the computing unit performs the interruption of the second switch and the diagnosis while a current flowing in the electromagnetic induction load is stationary, and
the computing unit does not perform the diagnosis during transient variation of the current flowing in the electromagnetic induction load.

7. The electromagnetic load driving device according to claim 1, wherein the computing unit acquires a duty cycle of a driving signal for driving the first switch,
the computing unit performs the interruption of the second switch and the diagnosis when the duty cycle is in a range between predetermined upper and lower limit duty values, and
the computing unit does not perform the diagnosis when the duty cycle is out of the range between the predetermined upper and lower limit duty values.

8. The electromagnetic load driving device according to claim 3, wherein the voltage detecting unit detects a first surge voltage and a second surge voltage during the interruption of the energizing current by the second switch, and
the computing unit diagnoses that the second switch is normal when the first surge voltage is in a range between first upper and lower limit voltages and when the second surge voltage is in a range between second upper and lower limit voltages, and the computing unit diagnoses that the second switch is abnormal when the first surge voltage is out of the range between the first upper and lower limit voltages or when the second surge voltage is out of the range between the second upper and lower limit voltages.

9. The electromagnetic load driving device according to claim 1, wherein the computing unit includes an edge detecting circuit configured to detect a rise edge and a fall edge of a detected result of the voltage detecting unit, and
the computing unit acquires the surge voltage detected by the voltage detecting unit at respective points of the detection of the rise edge and the detection of the fall edge by the edge detecting circuit, to diagnose whether the energizing path of the energizing current is normal, based on the surge voltage acquired.

10. The electromagnetic load driving device according to claim 9, further comprising a storage unit configured to store data indicating a correspondence between a quantity of the energizing current and an allowable interrupting time of the second switch during which a variation width from a target current of the energizing current during the interruption of the second switch, is allowed to be in a predetermined range,
wherein the computing unit does not perform the diagnosis when the rise edge detected by the edge detecting circuit is out of a range of the allowable interrupting time, and
the computing unit does not perform the diagnosis when the fall edge detected by the edge detecting circuit is out of a predetermined time range after the allowable interrupting time.

11. An in-vehicle control system comprising:
an electromagnetic induction load; and
an electromagnetic load driving device configured to drive the electromagnetic induction load,
wherein the electromagnetic load driving device includes:
a first switch configured to control an energizing current to be supplied to the electromagnetic induction load;
a second switch connected to the electromagnetic induction load in series, the second switch being configured to switch between interruption and energization of the energizing current;
a voltage detecting unit configured to detect a voltage between the second switch and the electromagnetic induction load; and
a computing unit configured to diagnose whether an energizing path of the energizing current is normal, based on a surge voltage detected by the voltage detecting unit when the second switch interrupts the energizing current during the control of the energizing current by the first switch.

* * * * *